(12) United States Patent
Higashi

(10) Patent No.: US 10,607,701 B2
(45) Date of Patent: Mar. 31, 2020

(54) SEMICONDUCTOR STORAGE DEVICE

(71) Applicant: Toshiba Memory Corporation, Minato-ku (JP)

(72) Inventor: Yusuke Higashi, Zushi (JP)

(73) Assignee: Toshiba Memory Corporation, Minato-ku (JP)

( * ) Notice: Subject to any disclaimer, the term of this patent is extended or adjusted under 35 U.S.C. 154(b) by 24 days.

(21) Appl. No.: 16/122,105

(22) Filed: Sep. 5, 2018

(65) Prior Publication Data

US 2019/0198111 A1 Jun. 27, 2019

(30) Foreign Application Priority Data

Dec. 25, 2017 (JP) ................. 2017-247810

(51) Int. Cl.
| | |
|---|---|
| G11C 11/22 | (2006.01) |
| G11C 16/08 | (2006.01) |
| G11C 16/04 | (2006.01) |
| G11C 16/32 | (2006.01) |
| G11C 7/08 | (2006.01) |
| G11C 16/26 | (2006.01) |
| G11C 16/34 | (2006.01) |

(Continued)

(52) U.S. Cl.
CPC ............... *G11C 16/08* (2013.01); *G11C 7/08* (2013.01); *G11C 11/223* (2013.01); *G11C 11/2257* (2013.01); *G11C 11/2275* (2013.01); *G11C 11/2277* (2013.01); *G11C 11/2293* (2013.01); *G11C 11/5628* (2013.01); *G11C 11/5657* (2013.01); *G11C 16/0483* (2013.01); *G11C 16/10* (2013.01); *G11C 16/24* (2013.01); *G11C 16/26* (2013.01); *G11C 16/32* (2013.01); *G11C 16/34* (2013.01); *G11C 16/3459* (2013.01); *G11C 2029/0411* (2013.01)

(58) Field of Classification Search
CPC ......... G11C 16/08; G11C 7/08; G11C 11/223; G11C 11/2257
USPC ........................................................ 365/145
See application file for complete search history.

(56) References Cited

U.S. PATENT DOCUMENTS

| | | | | |
|---|---|---|---|---|
| 8,762,581 B2 * | 6/2014 | Modelski | ............ | G06F 9/30058 709/203 |
| 2010/0014342 A1 * | 1/2010 | Hoya | ...................... | G11C 11/22 365/145 |

(Continued)

FOREIGN PATENT DOCUMENTS

| | | |
|---|---|---|
| JP | 2014-175020 | 9/2014 |
| JP | 2015-056485 | 3/2015 |

*Primary Examiner* — Vu A Le
(74) *Attorney, Agent, or Firm* — Oblon, McClelland, Maier & Neustadt, L.L.P.

(57) ABSTRACT

According to one embodiment, a semiconductor storage device includes: a first select transistor connected at a first end of a memory string; a second select transistor connected at a second end of the memory string; and a controller. In a write operation of writing data into a first memory cell transistor of the memory string, the controller performs: a first operation of applying a first voltage to a gate of the first memory cell transistor, while turning on the first and second select transistor; and a second operation of applying a second voltage higher than the first voltage to the gate of the first memory cell transistor, while turning off the first and second select transistor; and the second operation is performed after the first operation.

20 Claims, 18 Drawing Sheets

(51) Int. Cl.
*G11C 16/24* (2006.01)
*G11C 16/10* (2006.01)
*G11C 11/56* (2006.01)
G11C 29/04 (2006.01)

(56) References Cited

U.S. PATENT DOCUMENTS

| | | |
|---|---|---|
| 2014/0254274 A1 | 9/2014 | Shuto et al. |
| 2014/0340952 A1 | 11/2014 | Ramaswamy et al. |
| 2015/0007964 A1 | 1/2015 | Daly et al. |

\* cited by examiner

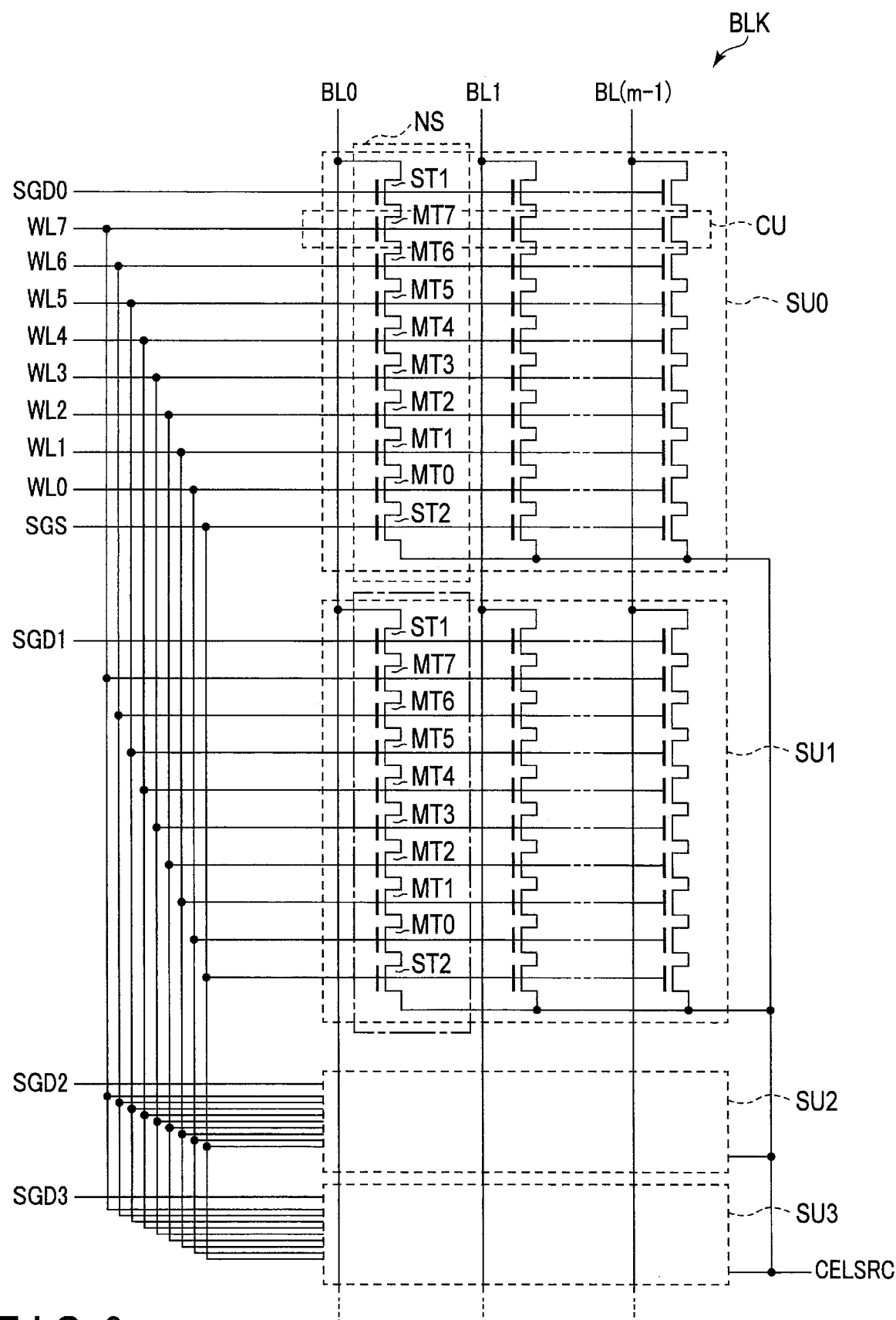
F I G. 3

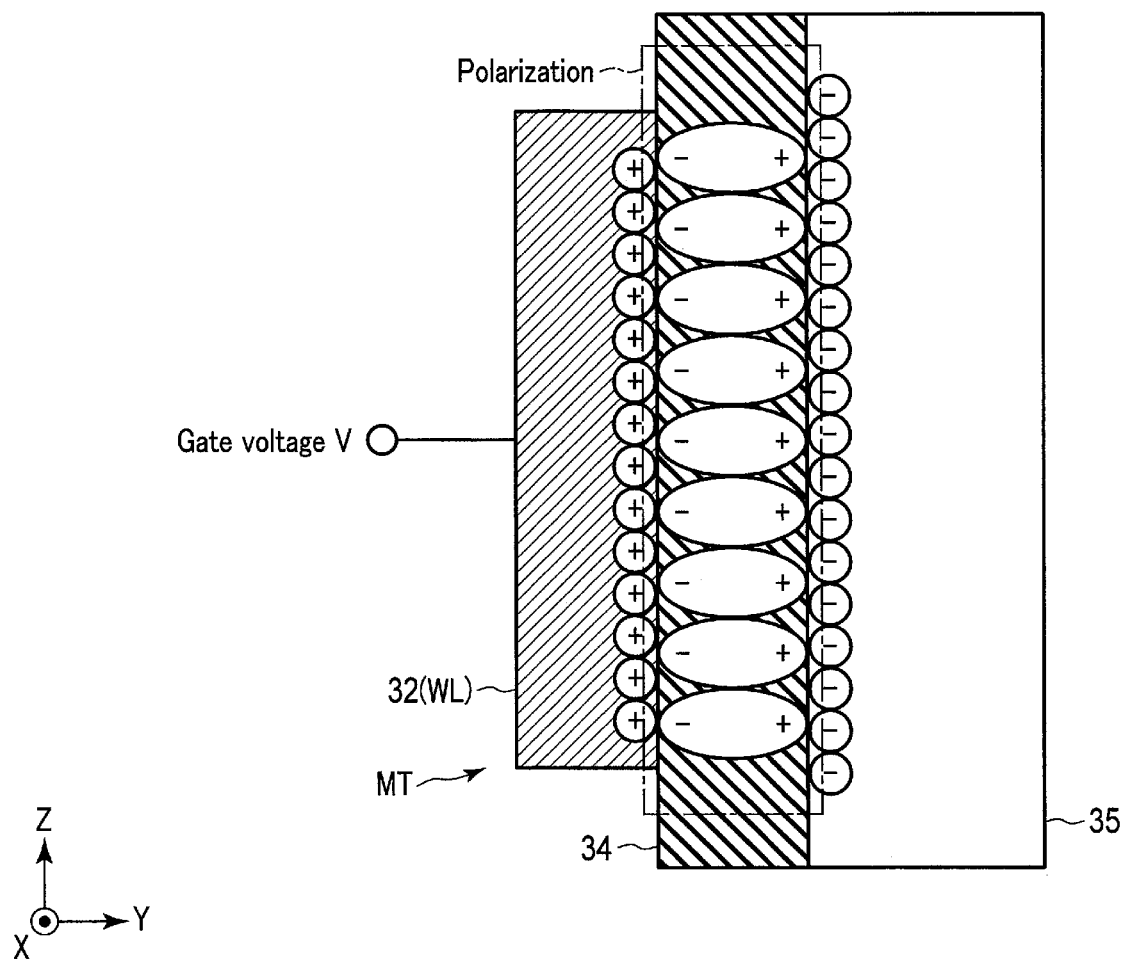
F I G. 5

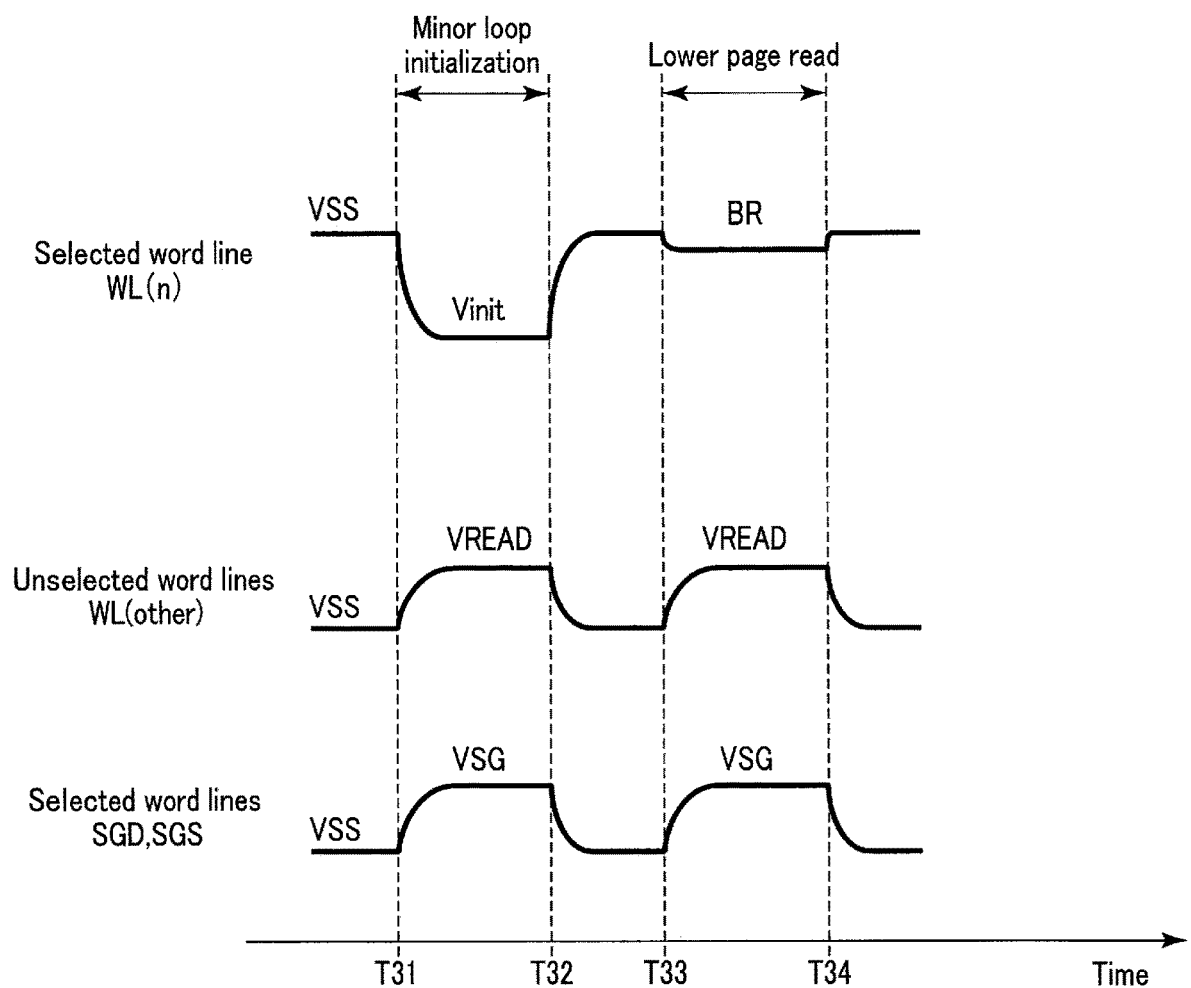
F I G. 17

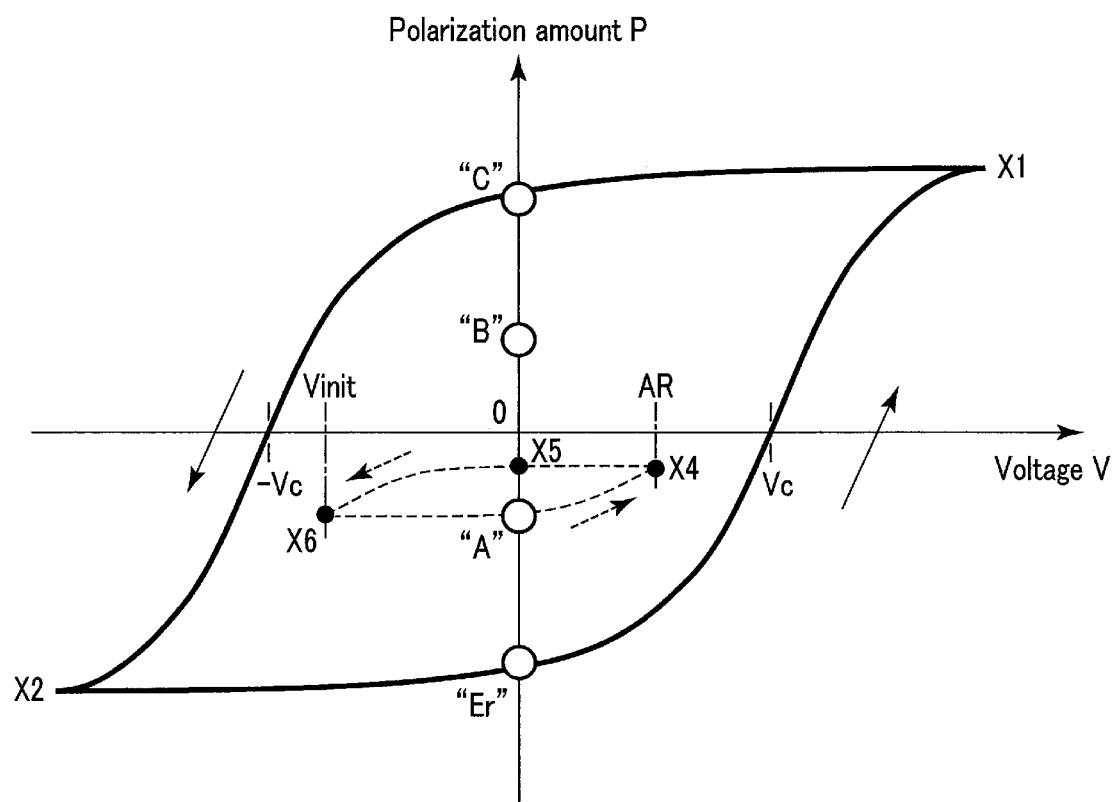
F I G. 18

SEMICONDUCTOR STORAGE DEVICE

CROSS-REFERENCE TO RELATED APPLICATIONS

This application is based upon and claims the benefit of priority from Japanese Patent Application No. 2017-247810, filed Dec. 25, 2017, the entire contents of which are incorporated herein by reference.

FIELD

Embodiments described herein relate generally to a semiconductor storage device.

BACKGROUND

A NAND flash memory as a semiconductor storage device is known.

BRIEF DESCRIPTION OF THE DRAWINGS

FIG. 3 is a circuit diagram for explaining a configuration of a memory cell array of the semiconductor storage device according to the first embodiment.

FIG. 5 is a schematic view for explaining a polarization operation in a memory cell transistor of the semiconductor storage device according to the first embodiment.

FIG. 17 is a timing chart for explaining the read operation in the semiconductor storage device according to the third embodiment.

FIG. 18 is a diagram for explaining the relationship between an amount of polarization and a gate voltage applied to the memory cell transistor of the semiconductor storage device according to the third embodiment.

DETAILED DESCRIPTION

In general, according to one embodiment, a semiconductor storage device includes a memory cell transistor string including a plurality of memory cell transistors connected in series; a first select transistor connected at a first end of the memory cell transistor string; a second select transistor connected at a second end of the memory cell transistor string; and a controller, wherein: in a write operation of writing data into a first memory cell transistor of the memory cell transistor string, the controller performs: a first operation of applying a first voltage to a gate of the first memory cell transistor, while turning on the first select transistor and the second select transistor; and a second operation of applying a second voltage which is higher than the first voltage to the gate of the first memory cell transistor, while turning off the first select transistor and the second select transistor; and the second operation is performed after the first operation.

Embodiments will be described with reference to the accompanying drawings. In the descriptions below, structural elements having similar functions and configurations will be denoted by the same reference symbols.

1. First Embodiment

A semiconductor storage device according to a first embodiment will be described. The semiconductor storage device according to the first embodiment includes, for example, a NAND type flash memory including a ferroelectric (FENAND: Ferroelectric NAND flash memory).

1.1 Configuration

A configuration of the semiconductor storage device according to the first embodiment will be described.

1.1.1 Overall Configuration of Memory System

Figure 1:
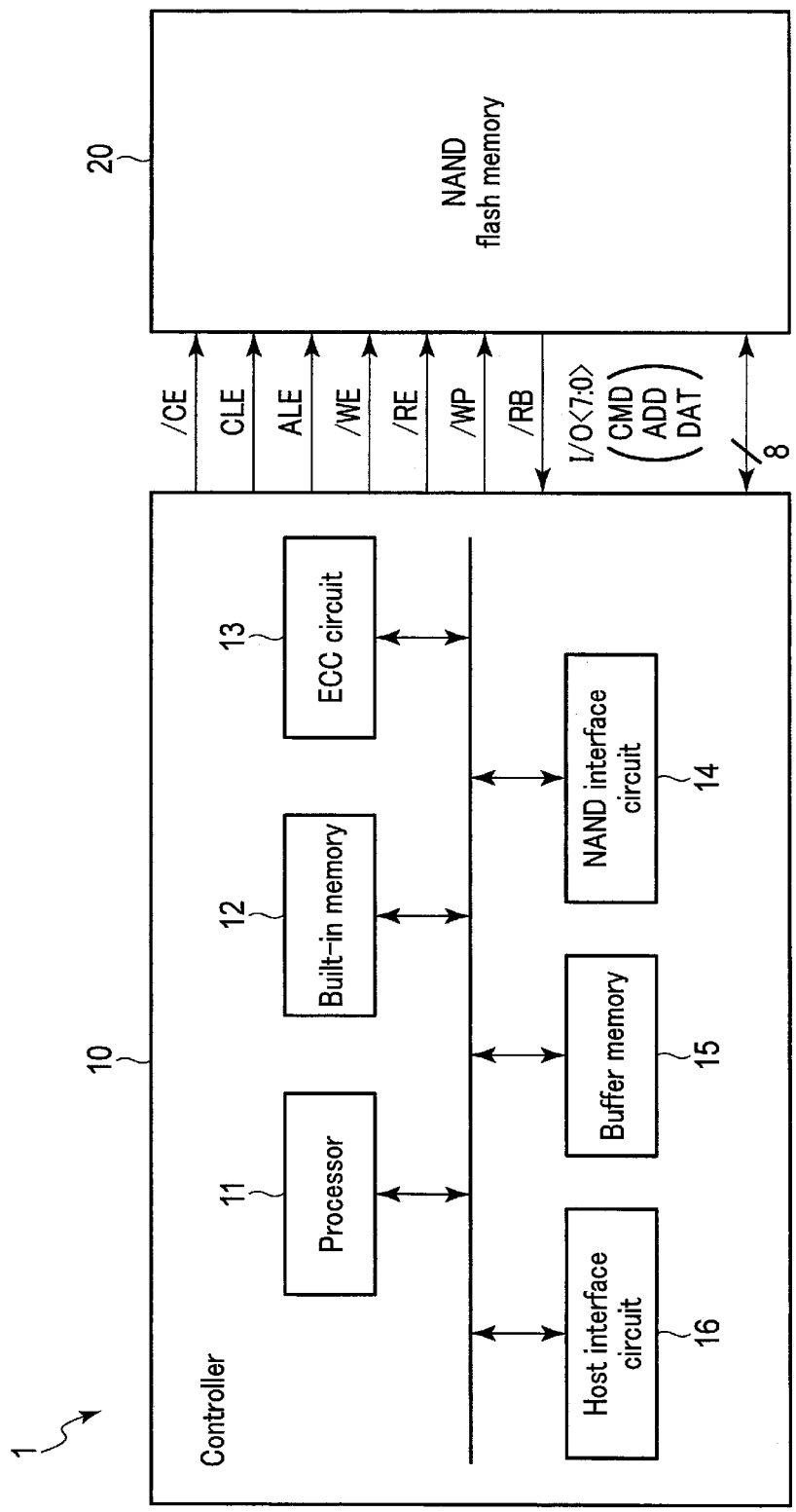
FIG. 1 is a block diagram for explaining a configuration of a memory system according to a first embodiment.

First, a configuration example of the memory system according to the first embodiment will be described with reference to FIG. 1. FIG. 1 is a block diagram illustrating an example of the configuration of the memory system according to the first embodiment. A memory system 1 is connected to an external host apparatus (not shown). The memory system 1 holds data from the host apparatus and reads data out to the host apparatus.

As shown in FIG. 1, the memory system 1 comprises a controller 10 and a semiconductor storage device (NAND flash memory) 20. The controller 10 receives instructions from the host apparatus, and controls the semiconductor storage device 20 based on the received instructions. Specifically, the controller 10 writes in the semiconductor storage device 20 the data which the host apparatus instructs to write, and reads from the semiconductor storage device 20 the data which the host apparatus instructs to read. The controller 10 is connected to the semiconductor storage device 20 through a NAND bus. The semiconductor storage device 20 comprises a plurality of memory cells, and stores data in a nonvolatile manner.

The NAND bus allows transmission and reception of each of signals /CE, CLE, ALE, /WE, /RE, /WP, /RB and I/O <7:0> in accordance with NAND interfaces through an individual line. The signal /CE is a signal to enable the semiconductor storage device 20. The signal CLE notifies the semiconductor storage device 20 that the signal I/O <7:0> flowing through the semiconductor storage device 20 while the signal CLE is of "H (High)" level is a command. The signal ALE notifies the semiconductor storage device 20 that the signal I/O <7:0> flowing through the semiconductor storage device 20 while the signal ALE is of "H" level is an address. The signal /WE instructs the semiconductor storage device 20 to fetch the signal I/O <7:0> flowing through the semiconductor storage device 20 while the signal /WE is of "L (Low)". The signal /RE instructs the semiconductor storage device 20 to output the signal I/O <7:0>. The signal /WP instructs the semiconductor storage device 20 to inhibit data writing and erasing. The signal /RE indicates that the semiconductor storage device 20 is a ready state (to accept an instruction from outside) or a busy state (not to accept an instruction from outside). The signal I/O <7:0> is a signal of, for example, 8 bits, respectively transmitted through different signal lines. The signal I/O <7:0> is an entity of data transmitted and received between the semiconductor storage device 20 and the controller 10, and includes a command CMD, an address ADD, and data DAT. The data DAT includes write data and read data.

1.1.2 Configuration of Controller

The controller of the memory system of the first embodiment will be described with reference to FIG. 1. The controller 10 comprises a processor (CPU: Central Processing Unit) 11, a built-in memory (RAM: Random Access Memory) 12, an ECC (Error Check and Correction) circuit 13, a NAND interface circuit 14, a buffer memory 15, and a host interface circuit 16.

The processor 11 controls the overall operation of the controller 10. The processor 11 issues a read instruction based on the NAND interfaces to the semiconductor storage device 20 in reply to a data read instruction received from, for example, the host apparatus. This operation is similar in writing and erasing. The processor 11 also has a function of executing various operations for read data from the semiconductor storage device 20.

The built-in memory 12 is a semiconductor memory, such as a DRAM (Dynamic RAM), and used as a work area of the processor 11. The built-in memory 12 holds firmware to manage the semiconductor storage device 20, and various management tables.

The ECC circuit 13 executes error detection and error correction processing. More specifically, when data is written, the ECC circuit 13 generates an ECC code for every set of a number of pieces of data based on data received from the host apparatus. When data is read, the ECC circuit 13 carries out ECC decoding based on the ECC code, and detects whether there is an error. If an error is detected, the ECC circuit 13 specifies the bit position and corrects the error.

The NAND interface circuit 14 is connected to the semiconductor storage device 20, and controls communications with the semiconductor storage device 20. The NAND interface circuit 14 transmits the command CMD, the address ADD, and the write data to the semiconductor storage device 20 in accordance with the instructions of the processor 11. The NAND interface circuit 14 receives the read data from the semiconductor storage device 20.

The buffer memory 15 temporarily holds data received by the controller 10 from the semiconductor storage device 20 and the host apparatus. The buffer memory 15 is also used as a storage area that temporarily stores, for example, read data from the semiconductor storage device 20, and an operation result for the read data.

The host interface circuit 16 is connected to the host apparatus, and controls communications with the host apparatus. The host interface circuit 16 transfers, for example, a command and data received from the host apparatus respectively to the processor 11 and the buffer memory 15.

1.1.3 Configuration of Semiconductor Storage Device

Figure 2:
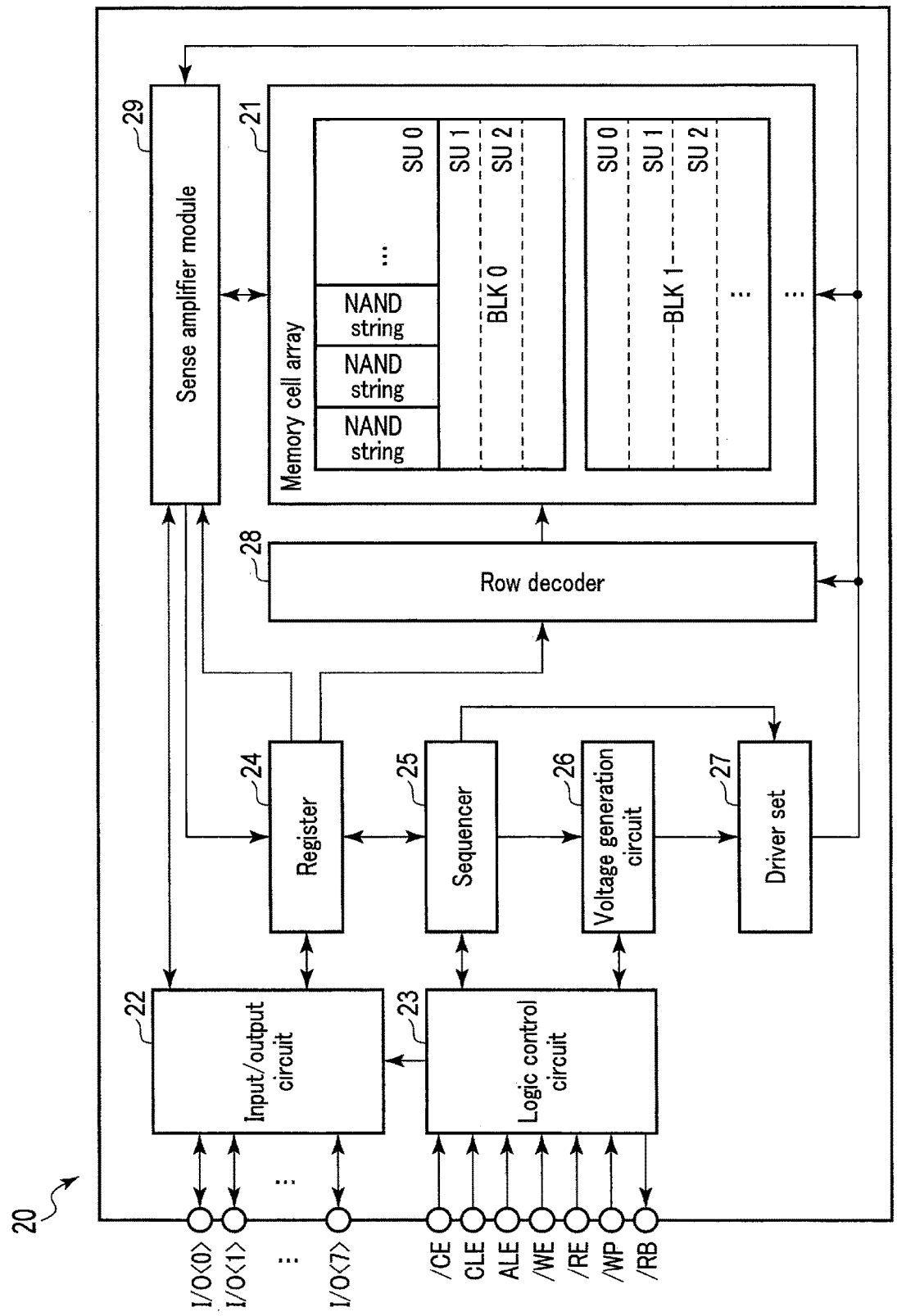
FIG. 2 is a block diagram for explaining a configuration of a semiconductor storage device according to the first embodiment.

First, a configuration example of the semiconductor storage device according to the first embodiment will be described with reference to FIG. 2. FIG. 2 is a block diagram illustrating an example of the configuration of the semiconductor storage device according to the first embodiment.

The semiconductor storage device 20 comprises a memory cell array 21, an input/output circuit 22, a logic control circuit 23, a register 24, a sequencer 25, a voltage generation circuit 26, a driver set 27, a row decoder 28, and a sense amplifier module 29.

The memory cell array 21 comprises a plurality of blocks BLK (BLK0, BLK1, . . . ). The block BLK includes a plurality of nonvolatile memory cell transistors (not shown) associated with word lines and bit lines. Block BLK is, for example, an erasure unit of data, and the data in one block BLK can be erased at a time. Each block BLK comprises a plurality of string units SU (SU0, SU1, SU2, . . . ). Each string unit SU is a set of NAND strings NS. Each NAND string NS includes a plurality of memory cell transistors. Each the number of blocks in the memory cell array 21, the number of string units in one block BLK, and the number of NAND strings in one string unit. SU can be set to any number.

The input/output circuit 22 transmits and receives the signal I/O <7:0> to and from the controller 10. The input/output circuit 22 transfers the command CMD and the address ADD in the signal I/O <7:0> to the register 24. The input/output circuit 22 transmits and receives the write data and the read data to and from the sense amplifier module 29.

The logic control circuit 23 receives the signal /CE, CLE, ALE, /WE, /RE, and /WP from the controller 10. Furthermore, the logic control circuit 23 transfers the signal /RB to the controller 10 to externally notify the state of the semiconductor storage device 20.

The register 24 holds the command CMD and the address ADD. The register 24 transfers the address ADD to the driver set 27, the row decoder 28, and the sense amplifier module 29, and transfers the command CMD to the sequencer 25.

The sequencer 25 receives the command CMD, and controls the whole of the semiconductor storage device 20 in accordance with the sequence based on the received command CMD.

The voltage generation circuit 26 generates voltages necessary for operations of data writing, reading, and erasure, based on the instructions from the sequencer 25. The voltage generation circuit 26 supplies the generated voltages to the driver set 27.

The driver set 27 supplies various voltages from the voltage generation circuit 26 to the row decoder 28 and the sense amplifier module 29 based on the address from the register 24. The driver set 27 supplies various voltages to the row decoder 28 based on, for example, a row address in the address ADD.

The row decoder 28 receives the row address in the address ADD from the register 24, and selects a block BLK based on the row address. Voltages from the driver set 27 are transferred to the selected block BLK through the row decoder 28.

In data reading time, the sense amplifier module 29 senses read data read from the memory cell transistor to a bit line, and transfers the sensed read data to the input/output circuit 22. In data writing time, the sense amplifier module 29 transfer write data written through a bit line to the memory cell transistor. Furthermore, the sense amplifier module 29 receives a column address in the address from the register 24, and outputs data of the column based on the column address.

1.1.4 Configuration of Memory Cell Array

A configuration of the memory cell array of the semiconductor storage device according to the first embodiment will be described with reference to FIG. 3. FIG. 3 is an example of a circuit diagram for explaining the configuration of the memory cell array of the semiconductor storage device according to the first embodiment.

As shown in FIG. 3, each of the NAND string NS comprises 8 memory cell transistors MT (MT0 through MT7), a select transistor ST1, and a select transistor ST2. The number of memory cell transistors MT is not limited to 8 but may be 16, 32, 64 or 128. That is, the number of memory cell transistors MT is not limited to a specific value. The memory cell transistor MT comprises a block insulation film using a ferroelectric between the gate and the channel. The memory cell transistors MT are connected in series between the select transistors ST1 and ST2. In the following explanation, the term "connect" includes a case in which two elements are connected with another conductive element interposed therebetween. For example, a dummy memory cell transistor (not shown) may be serially connected between the memory cell transistor MT7 and the select transistor ST1, and between the memory cell transistor MT0 and the select transistor ST2. For example, the dummy transistor may have a configuration similar to that of the memory cell transistor MT. The dummy memory cell transistor is not limited to one, but any number of dummy memory cell transistors may be connected in series.

The gates of the select transistors ST1 of the string units SU0 through SU3 of one block BLK are connected to select gate lines SGD0 through SGD3, respectively. The gates of the select transistors ST2 of all string units SU in the block are connected in common to the select gate line SGS. The control gates of the memory cell transistors MT0 through MT7 in the same block BLK are respectively connected to the word lines WL0 through WL7. Thus, the word line WL of the same address is connected in common to all string units SU in the same block BLK, and the select gate line SGS is connected in common to all string units SU in the same block BLK. On the other hand, the select gate line SGD is connected only one of the string units SU in the same block BLK.

Of the NAND strings NS arranged in the matrix pattern in the memory cell array 21, the end of the select transistor ST1 of the NAND strings NS of the same row, the end being not connected to the memory cell transistor, is connected to any one of m bit lines BL (BL0 through BL (m−1), where m is a natural number). The bit line BL is connected in common to the NAND strings NS of the same column in a plurality of blocks BLK.

The end of the select transistor ST2, the end being not connected to the memory cell transistor, is connected to a source line CELSRC. The source line CELSRC is connected in common to the NAND strings NS in the blocks BLK.

As described above, data erasure is performed at a time, for example, for the memory cell transistors MT in the same block BLK. In contrast, data reading or data writing can be performed at a time for a plurality of memory cell transistors MT, which are connected in common to a given word line WL of a given string unit SU of a given block BLK. The set of the memory cell transistors MT as described above, which are connected in common to a word line WL in a string unit SU, is called, for example, a cell unit CU. In other words, the cell unit CU is a set of memory cell transistors MT to which the write or read operation can be performed at a time.

One memory cell transistor MT can hold, for example, a plurality of pieces of bit data. In the same cell unit CU, a set of one bit data, which the memory cell transistors MT hold in the same order, is referred to as a "page". In other words, the page can be defined as a part of a memory space formed in a set of memory cell transistors MT in the same cell unit CU.

Figure 4:
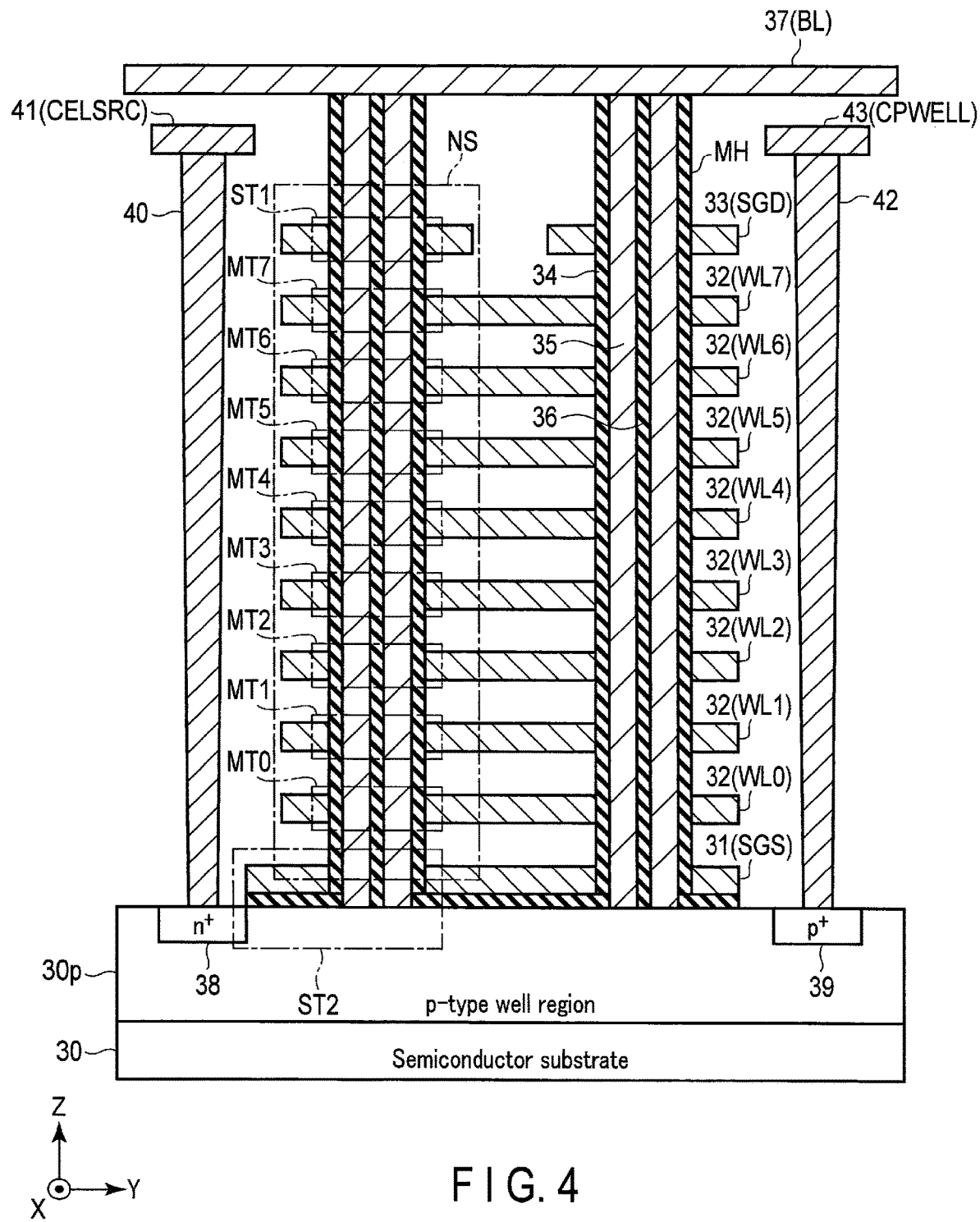
FIG. 4 is a cross-sectional view for explaining a configuration of the memory cell array of the semiconductor storage device according to the first embodiment.

Next, the cross-sectional structure of the memory cell array 21 will be described with reference to FIG. 4. FIG. 4 shows an example of a cross-sectional structure of a part of the memory cell array of the semiconductor storage device according to the first embodiment. FIG. 4 shows, in particular, a part relating to two string units SU0 and SU1 in one block BLK. Specifically, FIG. 4 shows two NAND strings NS of the two string units SU0 and SU1, and their surrounding parts. A plurality of NAND strings NS having a configuration shown in FIG. 4 are arrayed in X direction and Y direction. For example, a set of the NAND strings NS arrayed in X and Y direction corresponds to one string unit SU.

The semiconductor storage device 20 is provided on a semiconductor substrate 30. In the following explanation, a plane parallel to a surface of the semiconductor substrate 30 is referred to as an XY plane, and a direction perpendicular to the XY plane is referred to as Z direction. It is assumed that X direction and Y direction are at right angles to each other.

A p-type well region 30p is provided on the semiconductor substrate 30. The NAND strings NS are provided on the p-type well region 30p. Specifically, on the p-type well region 30p, for example, an interconnection layer 31 functioning as the select gate line SGS, eight interconnection layers 32 (WL0 through WL7) functioning as the word lines WL0 through WL7, and an interconnection layer 33 functioning as the select gate line SGD are stacked in this order. A plurality of interconnection layers 31 and a plurality of interconnection layers 33 may be stacked. An insulation film (not shown) is interposed between each adjacent two of the stacked interconnection layers 31 through 33.

The interconnection layer 31 is connected, for example, in common to the gates of the select transistors ST2 of the respective NAND strings NS of one block BLK. The interconnection layer 32 is connected in common to the control gates of the memory cell transistors MT of the respective NAND strings NS of one block BLK in each layer. The interconnection layer 33 is connected in common to the gates of the select transistors ST1 of the respective NAND strings NS of one string unit SU.

A memory hole MH is formed to reach the p-type well region 30p through the interconnection layers 33, 32, and 31. A ferroelectric film 34 and a semiconductor pillar (conductive film) 35 are provided in this order on the side surface of the memory hole MH. The ferroelectric film 34 functions as a block insulation film, and can change the direction of the electric polarization in accordance with the amount of the voltage applied to the interconnection layer 32. The semiconductor pillar 35 is formed of, for example, a non-doped polysilicon, and functions as a current path of the NAND string NS. In the semiconductor pillar 35, an insulation film 36 is buried. Thus, the semiconductor pillar 35 and the insulation film 36 form an SOI (Silicon on Insulator) structure. An interconnection layer 37 functioning as the bit line BL is provided on an upper end of the semiconductor pillar 35.

As described above, the select transistor ST2, the memory cell transistors MT, and the select transistor ST1 are stacked in this order on the p-type well region 30$p$, and one memory hole MH corresponds to one NAND string NS.

An $n^+$-type impurity diffusion layer 38 and a $p^+$-type impurity diffusion layer 39 are provided in an upper portion of the p-type well region 30$p$. A contact plug 40 is provided on an upper surface of the $n^+$-type impurity diffusion layer 38. An interconnection layer 41 functioning as the source line CELSRC is provided on an upper surface of the contact plug 40. A contact plug 42 is provided on an upper surface of the $p^+$-type impurity diffusion layer 39. An interconnection layer 43 functioning as a well line CPWELL is provided on an upper surface of the contact plug 42.

1.2. Operation

Operations of the semiconductor storage device according to the first embodiment will be explained.

1.2.1 Polarization Operation

Figure 6:
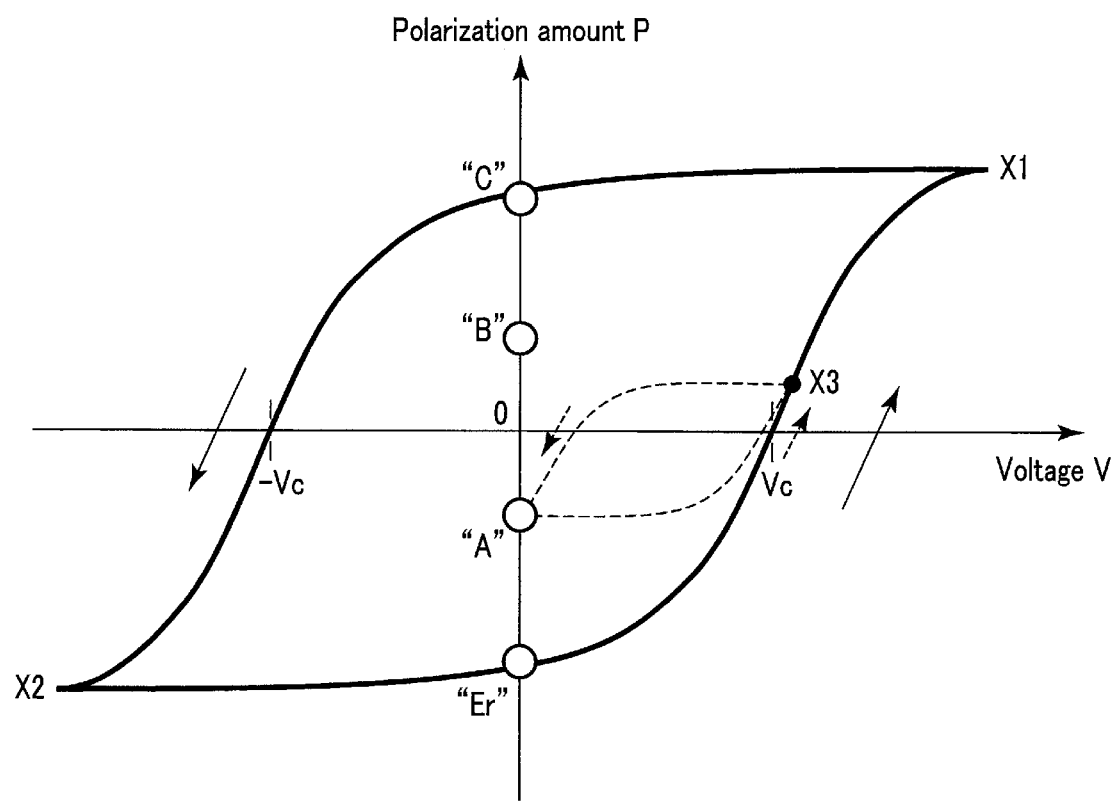
FIG. 6 is a diagram for explaining the relationship between an amount of polarization and a gate voltage applied to the memory cell transistor of the semiconductor storage device according to the first embodiment.

A polarization operation in the memory cell transistor of the semiconductor storage device according to the first embodiment will be explained with reference to FIG. 5 and FIG. 6. FIG. 5 is a schematic view for explaining a polarization operation in the memory cell transistor of the semiconductor storage device according to the first embodiment. FIG. 6 is a diagram for explaining the relationship between an amount of polarization and a gate voltage applied to the memory cell transistor of the semiconductor storage device according to the first embodiment.

As shown in FIG. 5, when a voltage V is applied to the word line WL in the memory cell transistor MT, an electric field is generated in the ferroelectric film 34. Under the influence of the electric field, for example, the positions of ions in a crystal lattice inside the ferroelectric film 34 change, so that polarization occurs. A polarization amount P indicative of the degree of polarization is represented by, for example, an amount of surface charge per unit area that is generated in the ferroelectric film 34 at a contact surface between the ferroelectric film 34 and the semiconductor pillar 35. In accordance with the polarization amount P, electrons of an amount that can compensate for the amount of surface charge are generated on the semiconductor pillar 35 in contact with the ferroelectric film 34.

If the voltage V applied to the word line WL is lower than a voltage Vc0, after the application of the voltage V is stopped, the ferroelectric film 34 returns to a state before the voltage V is applied. On the other hand, if the voltage V is equal to or higher than the voltage Vc0, the state of polarization of the ferroelectric film 34 in a certain amount is maintained even after the application of the voltage V is stopped. Therefore, after the application of the voltage V of Vc0 or higher is stopped, a part between the word line WL and the semiconductor pillar 35 stays as if the voltage of the amount corresponding to the amount P of polarization is applied, and the threshold voltage of the memory cell transistor MT decreases.

Next, the relationship between the voltage V applied to the word line WL and the polarization amount P will be explained with reference to FIG. 6. In FIG. 6, the horizontal axis represents the voltage V, and the vertical axis represents the polarization amount P. In the example of FIG. 6, the voltage V has a positive value, when a positive voltage is applied to the word line WL. The polarization amount P has a positive value, when the charge generated in the ferroelectric film 34 on the contact surface between the ferroelectric film 34 and the semiconductor pillar 35 is positive.

As shown in FIG. 6, the polarization characteristics of the ferroelectric film 34 are expressed by, for example, a hysteresis of a solid line (major loop), and a hysteresis of a broken line (minor loop).

More specifically, in an "Er" state, the voltage V is not applied and a negative polarization occurs.

As the positive voltage V is applied in the "Er" state, the polarization gradually occurs in the positive direction. When the voltage V is increased to be equal to the voltage Vc (>0), the polarization amount P becomes "0". The voltage Vc is a voltage at which the polarization amount P of the ferroelectric film 34 is "0", and referred to as a "coercive voltage". The voltage Vc0 mentioned above is almost equal to or slightly lower than the voltage Vc. Since the voltages Vc and Vc0 are characteristic values that are determined in accordance with characteristics of the ferroelectric film 34, they can take different values for the respective memory transistors MT. In the following, explanations will be given on the assumption that the voltages Vc and Vc0 take average values statistically for all memory cell transistors MT in the semiconductor storage device 20.

When the voltage V is further applied in the positive direction from the voltage Vc, the polarization amount P gradually comes close to a maximum value at a point X1. After the voltage V reaches the point X1, when the application of the voltage V is stopped, the ferroelectric film 34 is in a "C" state, in which the positive polarization amount P occurs.

In the "C" state, when a negative gate voltage V is applied, the polarization amount P is gradually decreased. When the voltage V reaches a voltage −Vc (<0), the polarization amount P becomes "0".

When the voltage V is further applied in the negative direction from the voltage −Vc, the polarization amount P gradually comes close to a minimum value at a point X2. After reaching the point X2, when the application of the voltage V is stopped, the state of the ferroelectric film 34 returns to the "Er" state in which the negative polarization amount P occurs.

In the manner described above, the major loop of the ferroelectric film 34 is obtained.

In the major loop, if the application of the voltage V is stopped before the point X1, the state of the ferroelectric film 34 can be an intermediate state between the "Er" state and the "C" state (partial polarization state). For example, if the application of the voltage V is stopped at a point X3 between the point X1 and the point where the voltage Vc0 is applied, the state of the ferroelectric film 34 becomes an "A" state along the broken line shown in FIG. 6. From the "A" state, when the positive voltage V is applied again, the polarization gradually occurs in the positive direction, and reaches the point X3 along the broken line shown in FIG. 6.

The hysteresis formed in the state where the ferroelectric film 34 is in the partial polarization is called the minor loop. The shape of the minor loop is not fixed, but may vary in accordance with the history of the application of the voltage V.

After the voltage V lower than the voltage Vc0 is applied, if the application of the voltage V is stopped, the polarization state of the ferroelectric film 34 can be returned to the state before the voltage V is applied. In other words, the voltage Vc0 can function as a threshold as to whether or not the polarization value P of the ferroelectric film 34 after the application of the voltage V is stopped can be increased.

Through the polarization operation described above, the polarization P of the ferroelectric film 34 can be any state between the "Er" state and the "C" state in accordance with the amount of the applied voltage V and the history of the application thereof. In addition to the "A" state described above, FIG. 6 shows a "B" state, in which the polarization amount P is greater than that in the "A" state; thus, FIG. 6 shows that the ferroelectric film 34 can take the four states of the "Er" state, the "A" state, the "B" state, and the "C" state.

1.2.2 Data Held in Memory Cell Transistor and Threshold Distribution

Figure 7:
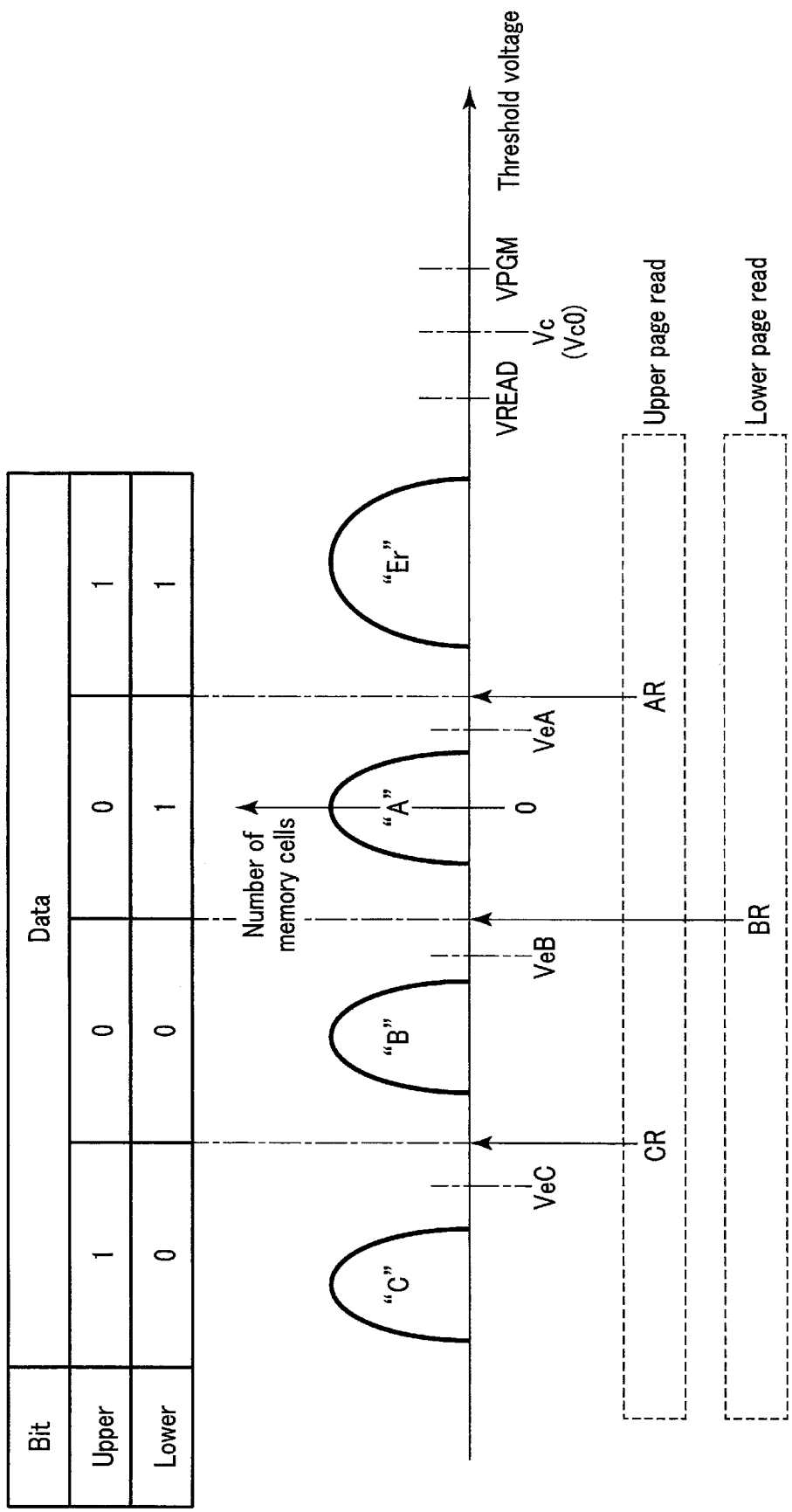
FIG. 7 is a diagram for explaining a distribution of threshold voltages of the semiconductor storage device according to the first embodiment.

Data held in memory cell transistors MT, threshold voltages and read voltage of the respective data will be explained with reference to FIG. 7. FIG. 7 is a schematic view showing data that can be held in the memory cell transistors, a threshold voltage distribution, and voltages used in reading time in the semiconductor storage device according to the first embodiment. FIG. 7 shows an example of the case in which one memory cell transistor MT holds two-bit data (MCL: Multi Level Cell).

As described above the memory cell transistor MT including the ferroelectric film 34 can take the four states of the "Er" state, the "A" state, the "B" state, and the "C" state. As also described above, since the four states have different polarization amounts P, the threshold voltage of the memory cell transistor MT varies. Specifically, the threshold voltage of the memory cell transistor MT is the highest in the "Er" state, and becomes lower in the "A" state, the "B" state, and the "C" state in this order. Therefore, the memory cell transistor MT can have four different threshold voltages in accordance with the polarization amount P of the ferroelectric film 34. Accordingly, the memory cell transistor M can hold two-bit data.

As shown in FIG. 7, the threshold voltage of the memory cell transistor MT in the "C" state is lower than a verification voltage VeC. The threshold voltage of the memory cell transistor MT in the "B" state is lower than a verification voltage VeB and higher than a read voltage CR, which is higher than the verification voltage VeC. The threshold voltage of the memory cell transistor MT in the "A" state is lower than a verification voltage VeA and higher than a read voltage BR, which is higher than the verification voltage VeB. The threshold voltage of the memory cell transistor MT in the "Er" state is lower than voltages VREAD and VPGM and higher than a read voltage AR, which is higher than the verification voltage VeA. The read voltage AR and the verification voltage VeA can be, for example, positive voltages, while the read voltages BR and CR and the verification voltages VeB and VeC can be, for example, negative voltages.

The voltage VREAD is, for example, lower than the voltage Vc. The voltage VREAD is a voltage, which is applied to the word line WL connected to a memory cell transistor MT that is not a target of reading during the read operation, and which turns on the memory cell transistor MT regardless of the held data. The voltage VPGM is, for example, higher than the voltage Vc. The voltage VPGM is a voltage of an amount which can increase the polarization amount P of the ferroelectric film 34 of the memory cell transistor MT.

The threshold voltage distribution described above is realized by writing two-bit (2-page) data consisting of a lower bit and an upper bit. Specifically, the relationship between the state of the memory cell transistor (the "Er" state to the "C" state) and the lower and upper bits are as follows:

"Er" state: "11" ("upper bit/lower bit")
"A" state: "01"
"B" state: "00"
"C" state: "10"

Thus, only one of the two bits is different in the data corresponding to two adjacent states in the threshold voltage distribution.

Therefore, to read a lower bit, it is only necessary to use a voltage corresponding to a boundary where the value of the lower bit ("0" or "1") changes. The same applies to an upper bit.

Specifically, as shown in FIG. 7, in the lower page read operation, the voltage BR, which differentiates between the "A" state and the "B" state is used as the read voltage. The lower page read operation determines whether or not the threshold voltage of the memory cell transistor MT is lower than the voltage BR.

In the upper page read operation, the voltage AR, which differentiates between the "Er state" and the "A" state, and the voltage CR, which differentiates between the "B" state and the "C" state are used as the read voltage. The upper page read operation includes the operation to determine whether or not the threshold voltage of the memory cell transistor MT is lower than the voltage AR, and the operation to determine whether or not the threshold voltage of the memory cell transistor MT is lower than the voltage CR.

1.2.3 Write Operation

A write operation of the semiconductor storage device according to the first embodiment will be explained.

In the following explanation, if the memory cell transistor MT or the word line WL connected to the memory cell transistor MT are targets of data writing, the element is referred to by the name with an addition of "select". If the element is not a target of data writing or data reading, it is referred to by the name with an addition of "unselected".

1.2.3.1 Timing Chart

Figure 8:
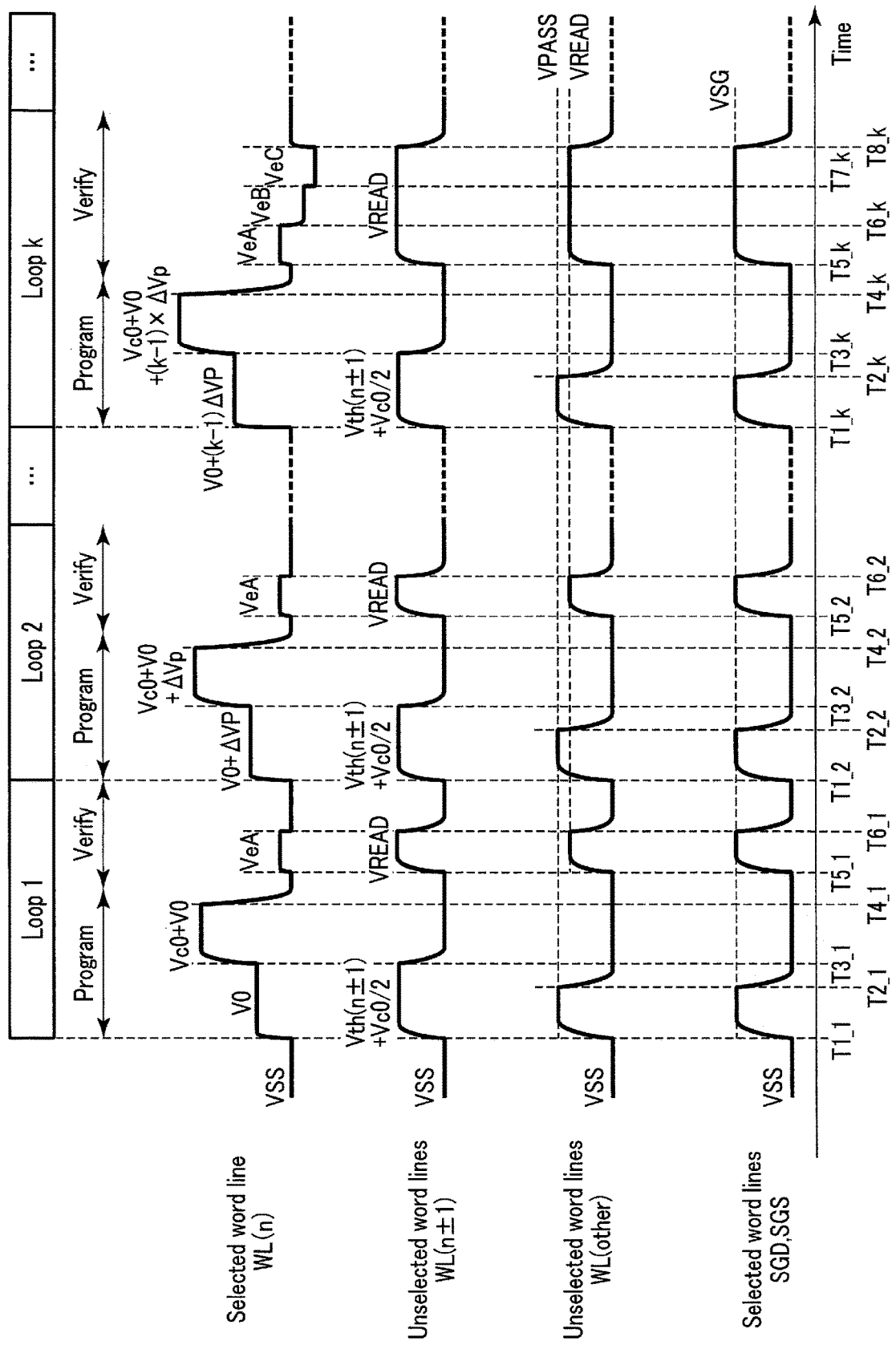
FIG. 8 is a timing chart for explaining a write operation in the semiconductor storage device according to the first embodiment.

FIG. 8 is a timing chart for explaining a write operation in the semiconductor storage device according to the first embodiment. FIG. 8 shows voltages applied to the word lines WL, and the select gate lines SGD and SGS. More specifically, a selected word line WL(n), a unselected word lines WL(n±1) adjacent to the selected word line WL(n), and the other unselected word lines WL(other). In the example shown in FIG. 8, n is an integer of 0 or more and 7 or less. If n is equal to 0 or 7, that is, if there is no word line WL corresponding to the unselected word lines WL(n±1) or the unselected word lines WL(other), it is assumed that the unselected word lines WL(n±1) or the unselected word lines WL(other) are dummy word lines connected to dummy memory cell transistors.

FIG. 8 shows a state of repeating a plurality of times the write operation to reduce the threshold voltage by increasing the polarization amount P of the ferroelectric film 34. In the explanation below, the repeat unit of the write operation is referred to as a "loop".

As shown in FIG. 8, the write operation includes a program operation and a verify operation in each loop.

Before time T1_1, a voltage VSS is applied to the selected word line WL, the unselected word lines WL, and the select gate lines SGD and SGS. The voltage VSS is, for example, a ground voltage, which does not affect the data writing into the memory cell transistor MT (for example, 0V).

From time T1_1 to time T6_1, a first loop is carried out. More specifically, from time T1_1 to time T4_1, a first program operation is carried out, and from time T5_1 to time T6_1, a verify operation corresponding to the first program operation is carried out.

At time T1_1, the row decoder 28 applies the voltage V0 to the selected word line WL(n). The voltage V0 is a voltage that can generate electrons contributing to increase of the polarization amount P of the ferroelectric film 34 in the selected memory cell transistor MT in the first loop on the semiconductor pillar 35, which is in contact with the ferroelectric film 34. Thus, the voltage V0 is higher than a threshold voltage Vth(n) of the memory cell transistor MT(n) in the "Er" state. The voltage V0 is preferably lower than the voltage Vc0. In other words, the voltage V0 is preferably of an amount that can turn on the selected memory cell transistor MT(n) but does not cause polarization.

The row decoder 28 applies a voltage Vth(n±1)+Vc0/2 to the unselected word lines WL(n±1), and applies a voltage VPASS to the unselected word lines WL(other). The voltage Vth(n±1) is the threshold voltage of the unselected memory cell transistor MT(n±1). The voltage Vth(n−1) and the voltage Vth(n+1) may be of different values in accordance with the data written in the memory cell transistor MT(n±1). An average value of all memory cell transistors MT in the semiconductor storage device 20 in each level is applied as the voltage Vth(n±1). Instead of the threshold voltage, the read voltage AR, BR, or CR, or the verification voltage VeA, VeB, or VeC may be applied as the voltage Vth(n±1).

The voltage VPASS is of an amount that can control the polarization amount of the ferroelectric film 34, while maintaining the unselected memory cell transistors MT in the ON state, in the NAND string NS including the selected memory cell transistor MT that increases the polarization amount. The voltage VPASS is of an amount that can increase the potential of a channel by coupling to such an extent as to suppress the reduction of the threshold voltage in the selected memory cell transistor MT, in the NAND string NS including the selected memory cell transistor MT that does not increase the polarization amount P.

The row decoder 28 applies a voltage VSG to the select gate lines SGD and SGS. The voltage VSG is a voltage that turns on the select transistors ST1 and ST2.

As a result, the selected memory cell transistor MT(n), the unselected memory cell transistors MT(n±1) and MT(other), and the select transistors ST1 and ST2 are turned on.

At time T2_1, the row decoder 28 applies the voltage VSS to the unselected word lines WL(other) and the select gate lines SGD and SGS. As a result, the unselected memory cell transistors MT(other) and the select transistors ST1 and ST2 are turned off.

At time T3_1, the row decoder 28 applies voltages Vc0+V0 and VSS respectively to the selected word line WL(n) and the unselected word lines WL(n±1). The voltage Vc0+V0 corresponds to the voltage VPGM in the first loop. As a result, the unselected memory cell transistors MT(n±1) are turned off, and the polarization amount P of the ferroelectric film 34 in the selected memory cell transistor MT(n) is increased by the amount corresponding to the voltage V0.

At time T4_1, the row decoder 28 applies the voltage VSS to the selected word line WL(n). As a result, the selected memory cell transistor MT(n) is turned off, and the program operation in the first loop is ended.

Subsequently, at time T5_1, the row decoder 28 applies the verification voltage VeA to the selected word line WL(n). The row decoder 28 applies the voltage VREAD to the unselected word lines WL(n±1) and WL(other). The row decoder 28 applies the voltage VSG to the select gate lines SGD and SGS. A current flows through the selected memory cell transistor MT(n) in the "A" state, and does not flow in a state where the memory cell transistor does not reach the "A" state (in the "Er" state). Therefore, the sense amplifier module 29 can ascertain the program progressing state of the selected memory cell transistor MT(n) (whether the state of the memory cell reaches the "A" state) by the first program operation.

At time T6_1, the row decoder 28 applies the voltage VSS to the selected word line WL(n), the unselected word lines WL(n±1) and WL(other), and the select gate lines SGD and SGS. As a result, the verify operation corresponding to the program operation in the first loop is ended.

In the above-mentioned manner, the write operation in the first loop is ended.

Subsequently, from time T1_2 to time T6_2, a second loop is carried out. More specifically, from time T1_2 to time T4_2, a second program operation is carried out, and from time T5_2 to time T6_2, a verify operation corresponding to the second program operation is carried out.

At time T1_2, the row decoder 28 applies a voltage V0+ΔVp to the selected word line WL(n), and a voltage Vth(n±1)+Vc0/2 to the unselected word lines WL(n±1). The voltage ΔVp is a voltage that can generate electrons contributing to increase of the polarization amount P of the ferroelectric film 34 in the selected memory cell transistor MT in the second and subsequent loops on the semiconductor pillar 35, which is in contact with the ferroelectric film 34. The voltage V0+ΔVp is preferably lower than the voltage Vc0. In other words, at time T1_2 when the voltage V0+ΔVp is applied to the selected word line WL(n), no polarization occurs.

The row decoder 28 applies the voltage VPASS to the unselected word lines WL(other), and the voltage VSG to the select gate lines SGD and SGS. As a result, the selected memory cell transistor MT(n), the unselected memory cell transistors MT(n±1) and MT(other), and the select transistors ST1 and ST2 are turned on.

At time T2_2, the row decoder 28 applies the voltage VSS to the unselected word lines WL(other) and the select gate lines SGD and SGS. As a result, the unselected memory cell transistors MT(other) and the select transistors ST1 and ST2 are turned off.

At time T3_2, the row decoder 28 applies voltages Vc0+V0+ΔVp and VSS respectively to the selected word line WL(n) and the unselected word lines WL(n±1). The voltage Vc0+V0+ΔVp corresponds to the voltage VPGM in the second loop. As a result, the unselected memory cell transistors MT(n±1) are turned off, and the polarization amount P of the ferroelectric film 34 in the selected memory cell transistor MT(n) is increased by the amount corresponding to the voltage ΔVp.

At time T4_2, the row decoder 28 applies the voltage VSS to the selected word line WL(n). As a result, the selected memory cell transistor MT(n) is turned off, and the program operation in the second loop is ended.

Subsequently, at time T5_2, the row decoder 28 applies the verification voltage VeA to the selected word line WL(n). The row decoder 28 applies the voltage VREAD to the unselected word lines WL(n±1) and WL(other). The row decoder 28 applies the voltage VSG to the select gate lines SGD and SGS.

At time T6_2, the row decoder 28 applies the voltage VSS to the selected word line WL(n), the unselected word lines WL(n±1) and WL(other), and the select gate lines SGD and SGS. As a result, the verify operation corresponding to the program operation in the second loop is ended.

In the above-mentioned manner, the write operation in the second loop is ended.

Thus, as the number of loops increases, the amount of the voltage VPGM applied to the selected word line WL(n) is increased stepwise.

Specifically, in the program operation in a k-th loop (from time T1_k to time T4_k, where k is a natural number), the row decoder 28 applies to the selected word line WL(n) the voltage V0+(k−1)ΔVp at time T1_k, and the voltage Vc0+V0+(k−1)ΔVp at time T3_k. The voltage V0+(k−1)ΔVp is preferably lower than the voltage Vc0. In other words, at time T1_k when the voltage V0+(k−1)ΔVp is applied to the selected word line WL(n), no polarization occurs. The voltage Vc0+V0+(k−1)ΔVp corresponds to the voltage VPGM in the k-th loop.

The row decoder 28 applies to the unselected word lines WL(n±1) a voltage Vth(n±1)+Vc0/2 at time T1_k, and the voltage VSS at time T3_k. The row decoder 28 applies to the unselected word lines WL(other) the voltage VPASS at time T1_k, and the voltage VSS at time T2_k. The row decoder 28 applies to the select gate lines SGD and SGS the voltage VSG at time T1_k, and the voltage VSS at time T2_k.

Through the operation described above, the ferroelectric film 34 in the selected memory cell transistor MT(n) is controlled to increase the amount of polarization by the amount corresponding to the voltage ΔVp.

In the verify operation in the k-th loop (from time T5_k to time T8_k), the row decoder 28 applies the verification voltages VeA, VeB, and VeC to the selected word line WL(n) at time T5_k, T6_k, and T7_k, respectively. Which of the verification voltages VeA, VeB, and VeC is applied in which loop may be determined in advance. If it is determined that desired data has been written in the selected memory cell transistor MT(n) by the verify operation, writing is inhibited in the subsequent loops. For example, the sense amplifier module 29 turns off the select transistor ST1 by causing the bit line BL, for which writing is inhibited, to be an inhibited state, thereby suppressing the occurrence of polarization and the reduction of the threshold voltage in the selected memory cell transistor MT(n).

In the above-mentioned manner, the write operation is ended.

The period from time T1_k to time T2_k is preferably several nanoseconds to several hundreds of nanoseconds to accumulate a desired number of electrons in the channel region.

The period from time T2_k to time T3_k is preferably several nanoseconds to several hundreds of nanoseconds to collect the electrons stored in the channel region of the selected memory cell transistor MT(n) without annihilating the electrons accumulated in the channel region.

The voltage Vth(n±1)+Vc0/2 applied to the unselected word lines WL(n±1) at time T1_k may be different from bit line to bit line BL in accordance with the data held in the unselected memory cell transistors MT(n±1). In this case, the write operation described above may be carried out for each bit line BL.

1.2.3.2 Program Operation in Each Loop

Of the write operation of the semiconductor storage device according to the first embodiment, a program operation in each loop will be described with reference to FIG. 9 to FIG. 11.

Figure 9:
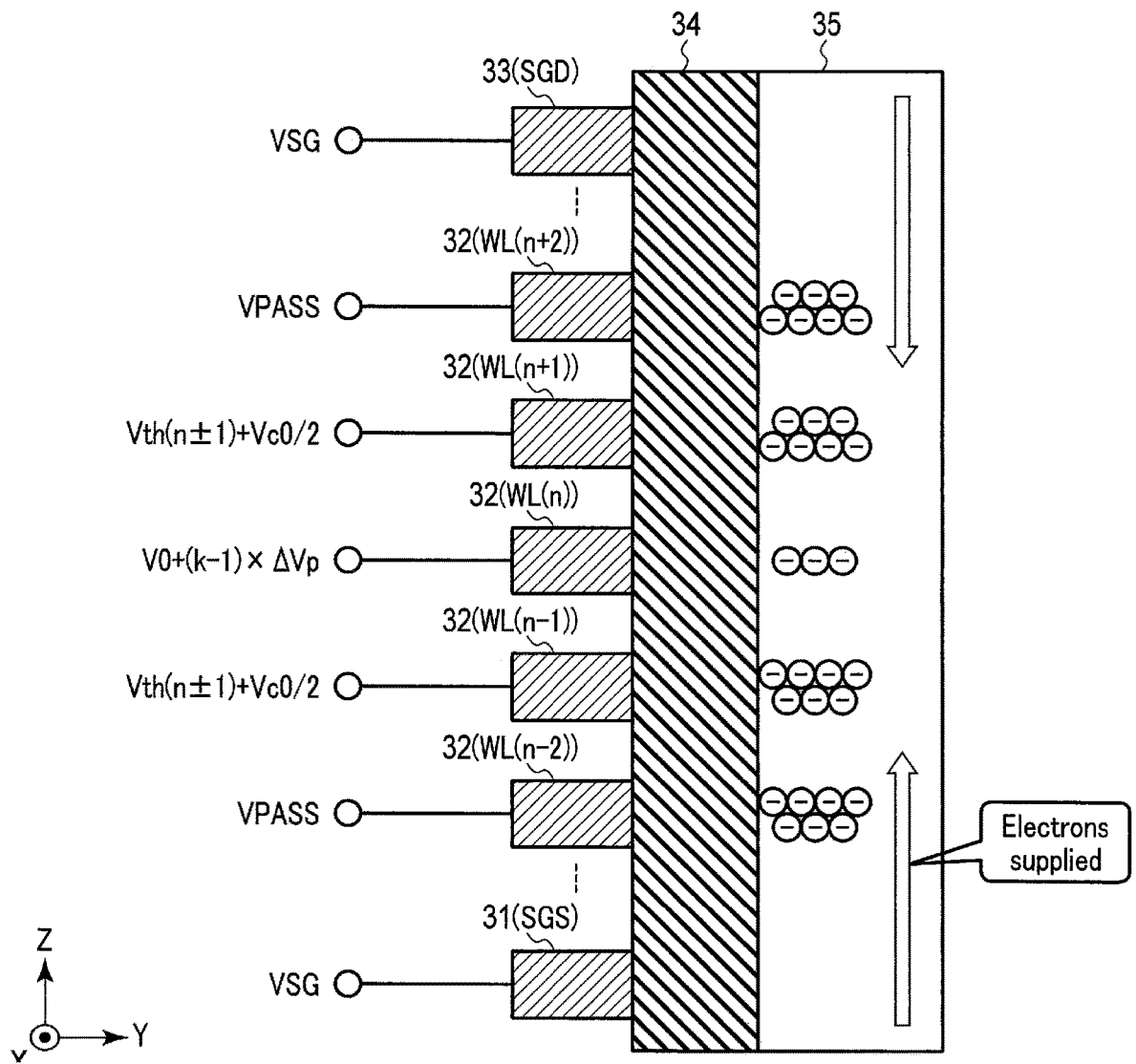
FIG. 9 is a schematic view for explaining a program operation in each loop of the semiconductor storage device according to the first embodiment.
Figure 10:
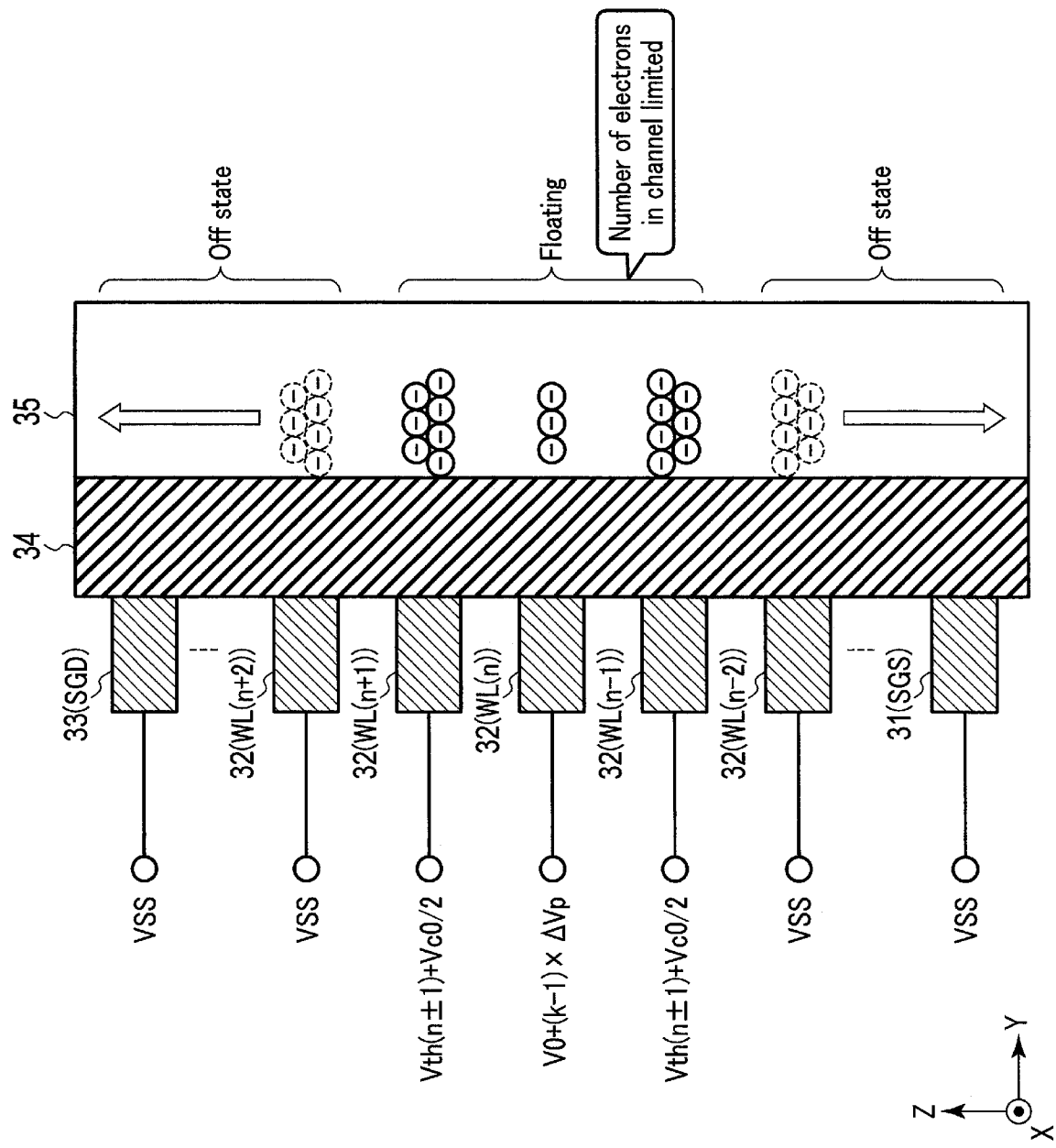
FIG. 10 is a schematic view for explaining a program operation in each loop of the semiconductor storage device according to the first embodiment.
Figure 11:
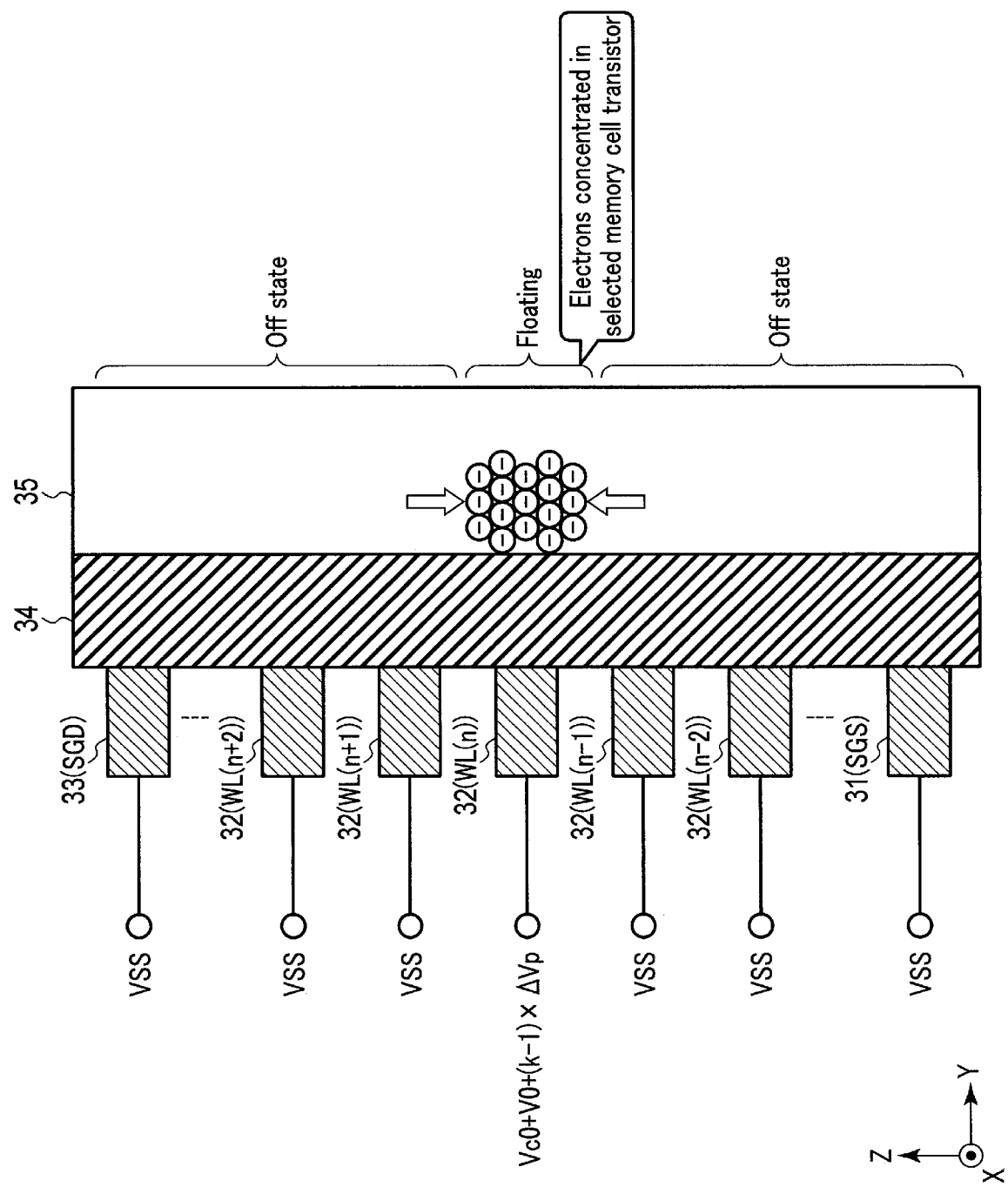
FIG. 11 is a schematic view for explaining a program operation in each loop of the semiconductor storage device according to the first embodiment.

FIG. 9 to FIG. 11 are schematic diagrams for explaining a program operation in each loop in a selected NAND string of the semiconductor storage device according to the first embodiment. FIG. 9 to FIG. 11 show the selected memory cell transistor MT(n), the unselected memory cell transistors MT(n±1) and MT(n±2), and the select transistors ST1 and ST2. FIG. 9, FIG. 10, and FIG. 11 respectively show states of the selected NAND string NS at time T1_k, T2_k, and T3_k explained above with reference to FIG. 8.

At time T1_k, the selected NAND string NS is connected to the bit line BL and the source line CELSRC, so that electrons can be supplied into the channel, as shown in FIG. 9. Accordingly, electrons of the number corresponding to the amount of the gate voltage are supplied to the channel region of each of the selected memory cell transistor MT(n), the unselected memory cell transistors MT (n±1) and MT(other).

Specifically, electrons of the number $N_E$(V0+(k−1)ΔVp−Vth(n)) corresponding to the voltage V0+(k−1)ΔVp are supplied to the channel region of the selected memory cell transistor MT(n), and electrons of the number $N_E$(Vc0/2) corresponding to the voltage Vth(n±1)+Vc0/2 and electrons of the number $N_E$(VPASS−Vth(other)) corresponding to the voltage VPASS are respectively supplied to the channel region of the unselected memory cell transistors MT(n±1) and the channel region of the unselected memory cell transistors MT(other). Since the voltages Vth(n±1)+Vc0/2 and VPASS are lower than the voltage Vc0, the polarization amount P of the unselected memory cell transistors MT(n±1) and MT(other) do not change. Furthermore, since the voltage V0+(k−1)ΔVp is lower than the voltage Vc0, the polarization amount P of the selected memory cell transistor MT(n) also does not change at time T1_k.

As shown in FIG. 10, the unselected memory cell transistors MT(other) and the select transistors ST1 and ST2 are off at time T2_k. As a result, the electrons of the number $N_E$(VPASS−Vth(other)) existing in the channel region of the unselected memory cell transistors MT(other) are discharged to the bit line BL via the select transistor ST1 or to the source line CELSRC via the select transistor ST2.

The NAND string NS is electrically cut from the bit line BL and the source line CELSRC. As a result, the channel regions of the unselected memory cell transistors MT(n±1) and the selected memory cell transistor MT(n) become floating with respect to the bit line BL and the source line CELSRC. Therefore, in the program operation in the current and subsequent loops, new electrons other than those supplied at time T1_k are not supplied to the channel regions of the unselected memory cell transistors MT(n±1) and the selected memory cell transistor MT(n). In other words, the number of electrons in the channel region of the selected NAND string NS is limited to (2×$N_E$(Vc0/2)+$N_E$(V0+(k−1)ΔVp−Vth(n))), which is the sum of 2×$N_E$(Vc0/2) corresponding to the number of the electrons existing in the channel region of the unselected memory cell transistors MT(n±1) and $N_E$(V0+(k−1)ΔVp−Vth(n)) corresponding to the number of electrons existing in the channel region of the selected memory cell transistor MT(n).

As shown in FIG. 11, at time T3_k, the selected memory cell transistor MT(n) and the unselected memory cell transistors MT(n±1) are respectively turned on and off, and the electrons supplied to the channel regions of the unselected memory cell transistors MT(n±1) concentrate in the channel region of the selected memory cell transistor MT(n). Thus, the number of electrons existing in the channel region of the selected memory cell transistor MT(n) is, for example, ($N_E$(Vc0+V0+(k−1)ΔVp−Vth(n))≈2×$N_E$(Vc0/2)+$N_E$(V0+(k−1)ΔVp−Vth(n))). Since the voltage Vc0+V0+(k−1)ΔVp is higher than the voltage Vc0, the polarization amount P of the selected memory cell transistor MT(n) changes. As a result, the threshold voltage of the selected memory cell transistor MT(n) is reduced.

Through the operation described above, when the voltage Vc0+V0+(k−1)ΔVp is applied to the selected memory cell transistor MT(n) as the write voltage VPGM, not an infinite number, but a limited number of the electrons existing in the channel regions are supplied to the selected memory cell transistor MT(n) through the bit line BL and the source line CELSRC. In other words, the program operation is executed while the limited number of electrons is supplied to the channel regions in each loop.

1.3 Effect of First Embodiment

According to the first embodiment, variation of the threshold voltages in data writing time can be suppressed. This effect will be described below.

In the write operation, at time T1_k, the row decoder 28 applies the voltage VSG to the select gate lines SGD and SGS, the voltage VPASS to the unselected memory cell transistors MT(other), and the voltage Vth(n±1)+Vc0/2 to the unselected memory cell transistors MT(n±1). At time T1_k, the row decoder 28 applies the voltage V0+(k−1)ΔVp to the selected word line WL(n). As a result, the select transistors ST1 and ST2, the selected memory cell transistor MT(n), and the unselected memory cell transistors MT(n±1) and MT(other) are turned on. Therefore, $N_E$(Vc0/2) electrons are supplied to the channel regions of the unselected memory cell transistors MT(n±1), and ($N_E$(V0+(k−1)ΔVp−Vth(n)) electrons are supplied to the selected memory cell transistor MT(n). At time T1_k, since the voltage lower than Vc0 is applied to the unselected memory cell transistors MT(n±1) and the selected memory cell transistor MT(n), data writing is suppressed.

At time T2_k, the row decoder 28 applies the voltage VSS to the select gate lines SGD and SGS and the unselected word lines WL(other). As a result, the select transistors ST1 and ST2 and the unselected memory cell transistors MT(other) are turned off, whereas the unselected memory cell transistors MT(n±1) and the selected memory cell transistor MT(n) become floating. Therefore, the numbers of electrons supplied to the unselected memory cell transistors MT(n±1) and the selected memory cell transistor MT(n) are limited to 2×$N_E$(Vc0/2) and ($N_E$(V0+(k−1)ΔVp−Vth(n)), which are the number of electrons supplied at time T1_k.

At time T3_k, the row decoder 28 applies the voltage Vc0+V0 to the selected word line WL(n), and the voltage VSS to the unselected word lines WL(n±1). As a result, the unselected memory cell transistors MT(n±1) are turned off. Therefore, the electrons accumulated in the channel regions at time T2_k can be collected in the channel regions in the selected memory cell transistor MT(n). The number of collected electrons is about $N_E$(Vc0+V0+(k−1)ΔVp−Vth(n)). Therefore, polarization of the ferroelectric film 34 occurs in the selected memory cell transistor MT(n).

The number of electrons collected in the selected memory cell transistor MT(n) is limited as described above. Accordingly, the magnitude of the electrical field applied to the ferroelectric film 34 by the collected electrons is q×$N_E$(Vc0+V0+(k−1)ΔVp−Vth(n))/Cf/Tf, where q is an elementary electric charge, Cf is an electric capacitance of the ferroelectric film 34, and Tf is a thickness of the ferroelectric film 34. Thus, the polarization amount P of the ferroelectric film 34 that increases in one loop is limited. The effect that the increased polarization amount P is limited in each loop will be explained below with reference to FIG. 12.

Figure 12:
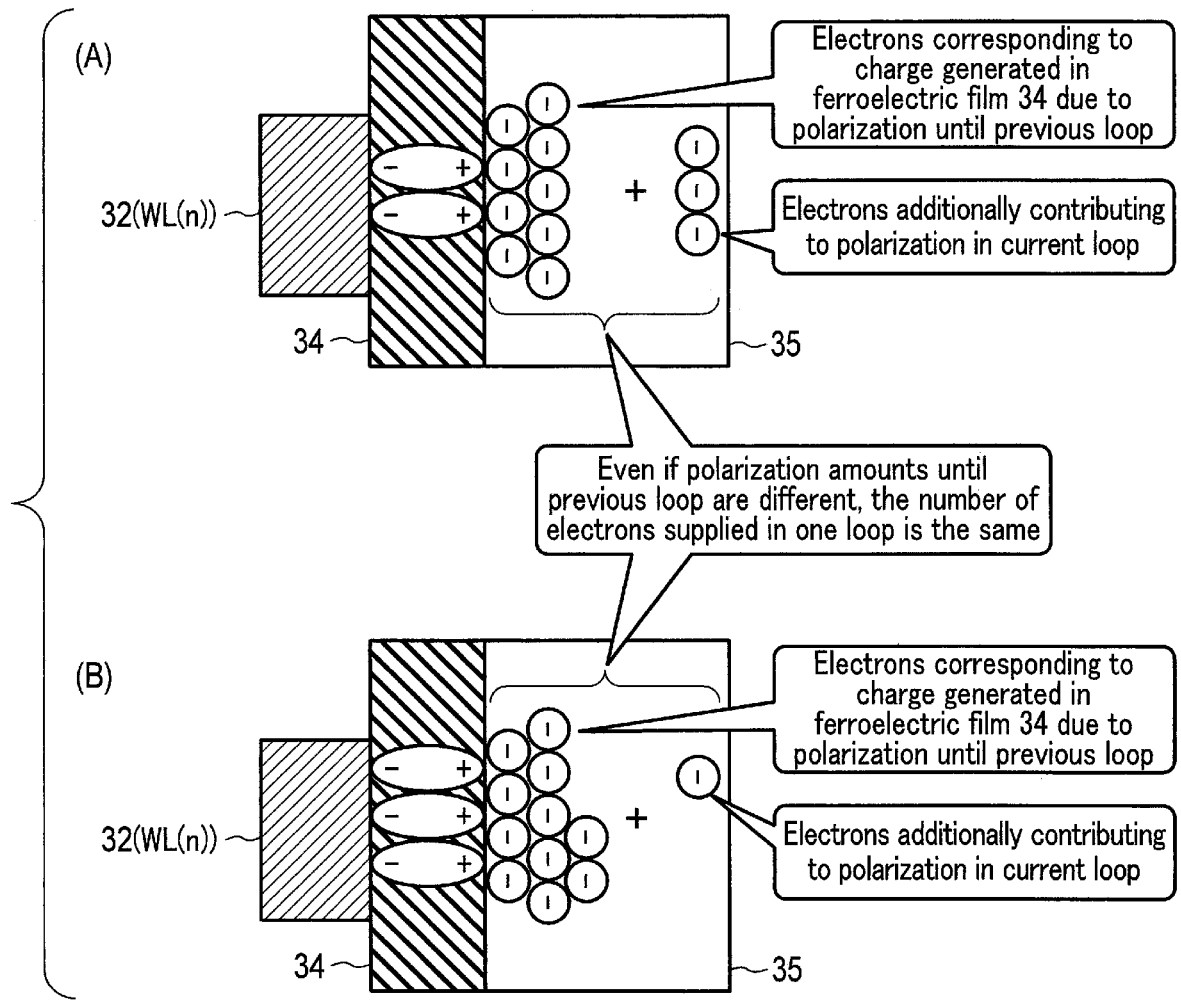
FIG. 12 is a schematic view for explaining an effect according to the first embodiment.

FIG. 12 is a schematic view for explaining an effect of the semiconductor storage device according to the first embodiment. Specifically, both FIG. 12 (A) and FIG. 12 (B) show a state in which the polarization amount P has been increased by the (k−1) program operations, and the k-th loop program operation is executed. Since polarization characteristics of the selected memory cell transistors MT(n) respectively shown in FIG. 12 (A) and FIG. 12 (B) are different from each other, the polarization amounts P increased by first through (k−1)-th loop program operations (i.e., the (k−1) program operations)) are different.

As shown in FIG. 12, the polarization amount P of the selected memory cell transistor MT(n) in the case of FIG. 12 (A) is smaller than that in the case of FIG. 12 (B). Therefore, the number of electrons generated on the semiconductor pillar 35 in accordance with the polarization is greater in the case of FIG. 12 (B) than in the case of FIG. 12 (A). However, although the polarization amounts P increased by the (k−1) program operations are different, the numbers of electrons supplied in the k-th program operation are the same in both the case of FIG. 12 (B) and the case of FIG. 12 (A). Accordingly, the number of electrons that can contribute to the further increase of the polarization amount P in the k-th program operation is greater in the case of FIG. 12 (A) than in the case of FIG. 12 (B). Thus, the polarization amount P increased by the k-th program operation is greater in the case of FIG. 12 (A) than in the case of FIG. 12 (B). Therefore, by stepwise data writing in a plurality of loops, when data is written in a memory cell transistor MT with progressed polarization, the change in threshold voltage can be relatively small, and when data is written in a memory cell transistor MT with less progressed polarization, the change in threshold voltage can be relatively large. Thus, the variation of the increase of the polarization amount P, due to a difference in characteristic between the memory cell transistors MT, can be suppressed. Accordingly, the variation of the threshold voltage can be suppressed.

The semiconductor pillar 35 in the NAND string NS is provided between the ferroelectric film 34 and the insulation film 36 and constitutes a SOI structure. With this structure, the electrons existing in the channel regions in the unselected memory cell transistors MT(n±1) and the selected memory cell transistor MT(n) at time T2_k are not immediately annihilated. Specifically, the electrons are not annihilated and can stay for about several nanoseconds to several hundreds of nanoseconds. Therefore, by controlling the period between time T2_k to time T3_k to about several nanoseconds to several hundreds of nanoseconds, data writing into the selected memory cell transistor MT(n) can be efficiently executed.

2. Second Embodiment

A semiconductor storage device according to a second embodiment will be described. In the second embodiment, the voltage applied to unselected word lines WL when electrons are supplied to a selected NAND string NS in a write operation is different from that in the first embodiment. In the following, explanations of the same configurations and operations as those in the first embodiment will be omitted, and only those different from the first embodiment will be explained.

2.1 Write Operation

A write operation of the semiconductor storage device according to the second embodiment will be explained.

Figure 13:
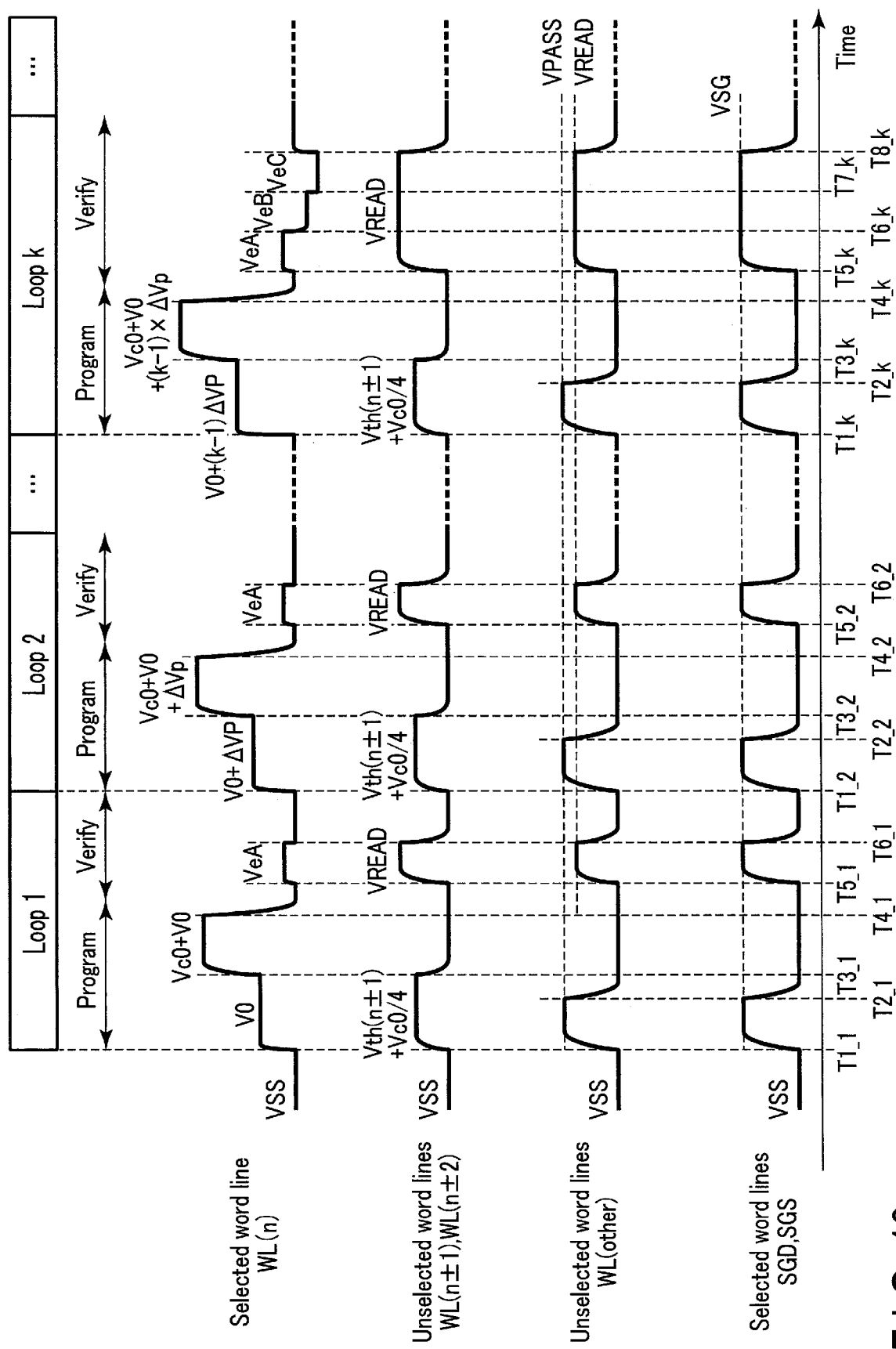
FIG. 13 is a timing chart for explaining a write operation in a semiconductor storage device according to a second embodiment.

FIG. 13 is a timing chart for explaining a write operation in the semiconductor storage device according to the second embodiment. FIG. 13 corresponds to FIG. 8 used in the explanation of the first embodiment. Time T1_1 to time T6_1, time T1_2 to time T6_2, and time T1_k to time T8_k in FIG. 13 correspond to time T1_1 to time T6_1, time T1_2 to time T6_2, and time T1_k to time T8_k in FIG. 8.

Explanations will be given on the assumption that a unselected word lines WL(other) are unselected word lines WL other than unselected word lines WL(n±1) and WL(n±2) in FIG. 13.

As shown in FIG. 13, write operations of the selected word line WL(n), the unselected word lines (other), and select gate lines SGD and SGS are the same as those shown in FIG. 8, and explanations thereof are omitted.

At time T1_1, the row decoder 28 applies the voltage Vth(n±1)+Vc0/4 to the unselected word lines WL(n±1) and WL(n±2). As a result, each of the unselected memory cell transistors MT(n±1) and MT(n±2) is turned on, and $N_E(Vc0/4)$ electrons are supplied to the channel regions.

At time T2_1, the row decoder 28 applies the voltage VSS to the unselected word lines WL(other) and the select gate lines SGD and SGS. As a result, the unselected memory cell transistors MT(other) and the select transistors ST1 and ST2 are turned off, whereas the selected memory cell transistor MT(n) and the unselected memory cell transistors MT(n±1) and MT(n±2) become floating. Therefore, in the program operation in the current and subsequent loops, new electrons other than those supplied at time T1_1 are not supplied to the channel regions of the unselected memory cell transistors MT(n±1) and MT(n±2), and the selected memory cell transistor MT(n). In other words, the number of electrons in the channel region of the selected NAND string NS is limited to $(4 \times N_E(Vc0/4)+N_E(V0-Vth(n)))$, which is the sum of $4 \times N_E(Vc0/4)$ corresponding to the number of electrons existing in the channel region of the unselected memory cell transistors MT(n±1) and MT(n±2) and $N_E(V0)$ corresponding to the number of electrons existing in the channel region of the selected memory cell transistor MT(n).

At time T3_1, the row decoder 28 applies the voltage Vc0+V0 to the selected word line WL(n). The row decoder 28 also applies the voltage VSS to the unselected word lines WL(n±1) and WL(n±2). As a result, the selected memory cell transistor MT(n) and the unselected memory cell transistors MT(n±1) and MT(n±2) are respectively turned on and off, and the electrons supplied to the channel regions of the unselected memory cell transistors MT(n±1) and MT(n±2) concentrate in the channel region of the selected memory cell transistor MT(n). Thus, the number of electrons existing in the channel region of the selected memory cell transistor MT(n) is, for example, $(N_E(Vc0+V0-Vth(n)) \approx 4 \times N_E(Vc0/4)+N_E(V0-Vth(n)))$. Since the voltage Vc0+V0 is higher than the voltage Vc0, the polarization amount P of the selected memory cell transistor MT(n) changes. As a result, the threshold voltage of the selected memory cell transistor MT(n) is reduced.

Through the operation described above, when the voltage Vc0+V0 is applied to the selected memory cell transistor MT(n) as the write voltage VPGM, a limited number of the electrons existing in the channel regions are supplied to the selected memory cell transistor MT(n) through the bit line BL and the source line CELSRC. In other words, the program operation is executed while the limited number of electrons is supplied to the channel regions in each loop.

The operations in time T4_1 to time T6_1 in the first loop are the same as those in time T4_1 to time T6_1 described with reference to FIG. 8, and explanations thereof are omitted.

In the above-mentioned manner, the write operation in the first loop is ended.

The operations of the unselected word lines WL(n±1) and WL(n±2) in the second and subsequent loops are the same as those in the first loop, and the operations of the selected word line WL(n), the unselected word lines WL(other), and the select gate lines SGD and SGS in the second and subsequent loops are the same as those of the selected word line WL(n), the unselected word lines WL(other), and the select gate lines SGD and SGS described with reference to FIG. 8, and explanations thereof are omitted.

2.2 Effect of Second Embodiment

According to the second embodiment, at time T1_k, the row decoder 28 applies the voltage Vth(n±1)+Vc0/4 to the unselected word lines WL(n±1) and WL(n±2). As a result, the electrons finally collected in the selected memory cell transistor MT(n) can be accumulated by using four unselected memory cell transistors MT(n±1) and MT(n±2). Therefore, as compared to the case of not using the unselected memory cell transistors MT(n±2), the voltage applied to the unselected word lines WL(n±1) and WL(n±2) can be lower. Furthermore, erroneous writing into the unselected memory cell transistors MT(n±1) can be suppressed.

2.3 Modifications of Second Embodiment

The second embodiment is not limited to the above examples, and can be modified in various ways.

In the second embodiment, when electrons are supplied to the selected NAND string NS, electrons corresponding to the voltage Vc0 are divided into quarters, and evenly supplied to the unselected word lines WL(n±1) and WL(n±2). However, the second embodiment is not limited to this example. For example, the electrons corresponding to the voltage Vc0 may be unevenly supplied to the unselected word lines WL(n±1) and WL(n±2).

Figure 14:
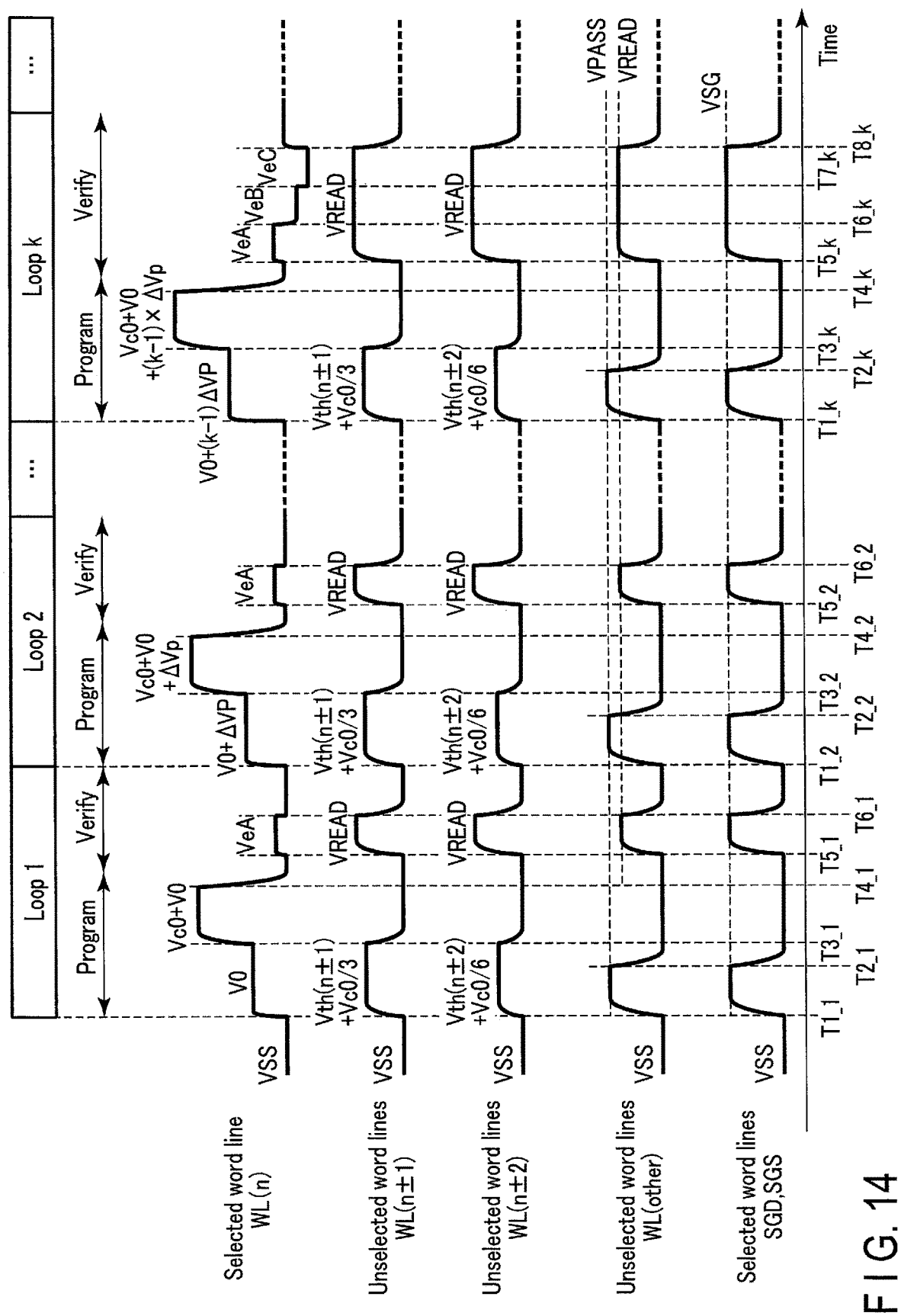
FIG. 14 is a timing chart for explaining a write operation in a semiconductor storage device according to a modification of the second embodiment.

FIG. 14 is a timing chart for explaining a write operation in a semiconductor storage device according to a modification of the second embodiment. FIG. 14 corresponds to FIG. 13 used in the explanation of the second embodiment. Time T1_1 to time T6_1, time T1_2 to time T6_2, and time T1_k to time T8_k in FIG. 14 correspond to time T1_1 to time T6_1, time T1_2 to time T6_2, and time T1_k to time T8_k in FIG. 13.

As shown in FIG. 14, write operations of the selected word line WL(n), the unselected word lines (other), and select gate lines SGD and SGS are the same as those shown in FIG. 13, and explanations thereof are omitted.

At time T1_1, the row decoder 28 applies the voltage Vth(n±1)+Vc0/3 and the voltage Vth(n±2)+Vc0/6 respectively to the unselected word lines WL(n±1) and WL(n±2). As a result, each of the unselected memory cell transistors MT(n±1) and MT(n±2) is turned on, and $N_E(Vc0/3)$ electrons and $N_E(Vc0/6)$ electrons are supplied to the respective channel regions.

At time T2_1, the row decoder 28 applies the voltage VSS to the unselected word lines WL(other) and the select gate lines SGD and SGS. As a result, the unselected memory cell transistors MT(other) and the select transistors ST1 and ST2 are turned off, whereas the selected memory cell transistor MT(n) and the unselected memory cell transistors MT(n±1) and MT(n±2) become floating. Therefore, in the program operation in the current and subsequent loops, new electrons other than those supplied at time T1_1 are not supplied to the channel regions of the unselected memory cell transistors MT(n±1) and MT(n±2), and the selected memory cell transistor MT(n). In other words, the number of electrons in the channel region of the selected NAND string NS is limited to $(2 \times N_E(Vc0/3)+2 \times N_E(Vc0/6)+N_E(V0-Vth(n)))$, which is the sum of $2 \times N_E(Vc0/3)$ corresponding to the number of the electrons existing in the channel region of the unselected memory cell transistors MT(n±1), $2 \times N_E(Vc0/6)$ corresponding to the number of the electrons existing in the channel region of the unselected memory cell transistors MT(n±2), and $N_E(V0-Vth(n))$ corresponding to the number of electrons existing in the channel region of the selected memory cell transistor MT(n).

At time T3_1, the row decoder 28 applies the voltage Vc0+V0 to the selected word line WL(n). The row decoder 28 also applies the voltage VSS to the unselected word lines WL(n±1) and WL(n±2). As a result, the selected memory cell transistor MT(n) and the unselected memory cell transistors MT(n±1) and MT(n±2) are respectively turned on and off, and the electrons supplied to the channel regions of the unselected memory cell transistors MT(n±1) and MT(n±2) concentrate into the channel region of the selected memory cell transistor MT(n). Thus, the number of electrons existing in the channel region of the selected memory cell transistor MT(n) is, for example, $(N_E(Vc0+V0-Vth(n)) \approx 2 \times N_E(Vc0/3) + 2 \times N_E(Vc0/6) + N_E(V0-Vth(n)))$. Since the voltage Vc0+V0 is higher than the voltage Vc0, the polarization amount P of the selected memory cell transistor MT(n) changes. As a result, the threshold voltage of the selected memory cell transistor MT(n) is reduced.

The operations in time T4_1 to time T6_1 in the first loop are the same as those in time T4_1 to time T6_1 described with reference to FIG. 13, and explanations thereof are omitted.

In the above-mentioned manner, the write operation in the first loop is ended.

The operations of the unselected word lines WL(n±1) and WL(n±2) in the second and subsequent loops are the same as those in the first loop, and the operations of the selected word line WL(n), the unselected word lines WL(other), and the select gate lines SGD and SGS in the second and subsequent loops are the same as those of the selected word line WL(n), the unselected word lines WL(other), and the select gate lines SGD and SGS described with reference to FIG. 13, and explanations thereof are omitted.

According to the modification of the second embodiment, at time T1_k, the row decoder 28 applies the voltage Vth(n±1)+Vc0/3 to the unselected word lines WL(n±1), and the voltage Vth(n±2)+Vc0/6 to the unselected word lines WL(n±2). As a result, if there is unselected memory cell transistors MT, which are liable to cause erroneous writing, a lower voltage can be applied to the corresponding unselected word lines WL. Furthermore, a unselected memory cell transistors MT nearer to the selected memory cell transistor MT(n) may easily collect accumulated electrons into the selected memory cell transistor MT(n). In such a case, a higher voltage can be applied to the unselected word lines WL(n±1). Thus, writing can be carried out efficiently in the selected memory cell transistor MT(n), while erroneous writing in the unselected memory cell transistors MT are suppressed.

3. Third Embodiment

Next, a semiconductor storage device according to a third embodiment will be described. In the third embodiment, in a verify operation or a read operation, before applying a verification voltage or a read voltage, initialization to perform a read operation on the same minor loop is carried out. In the following, explanations of the same configurations and operations as those in the first embodiment will be omitted, and only those different from the first embodiment will be explained.

3.1 Write Operation

A write operation of the semiconductor storage device according to the third embodiment will be explained.

Figure 15:
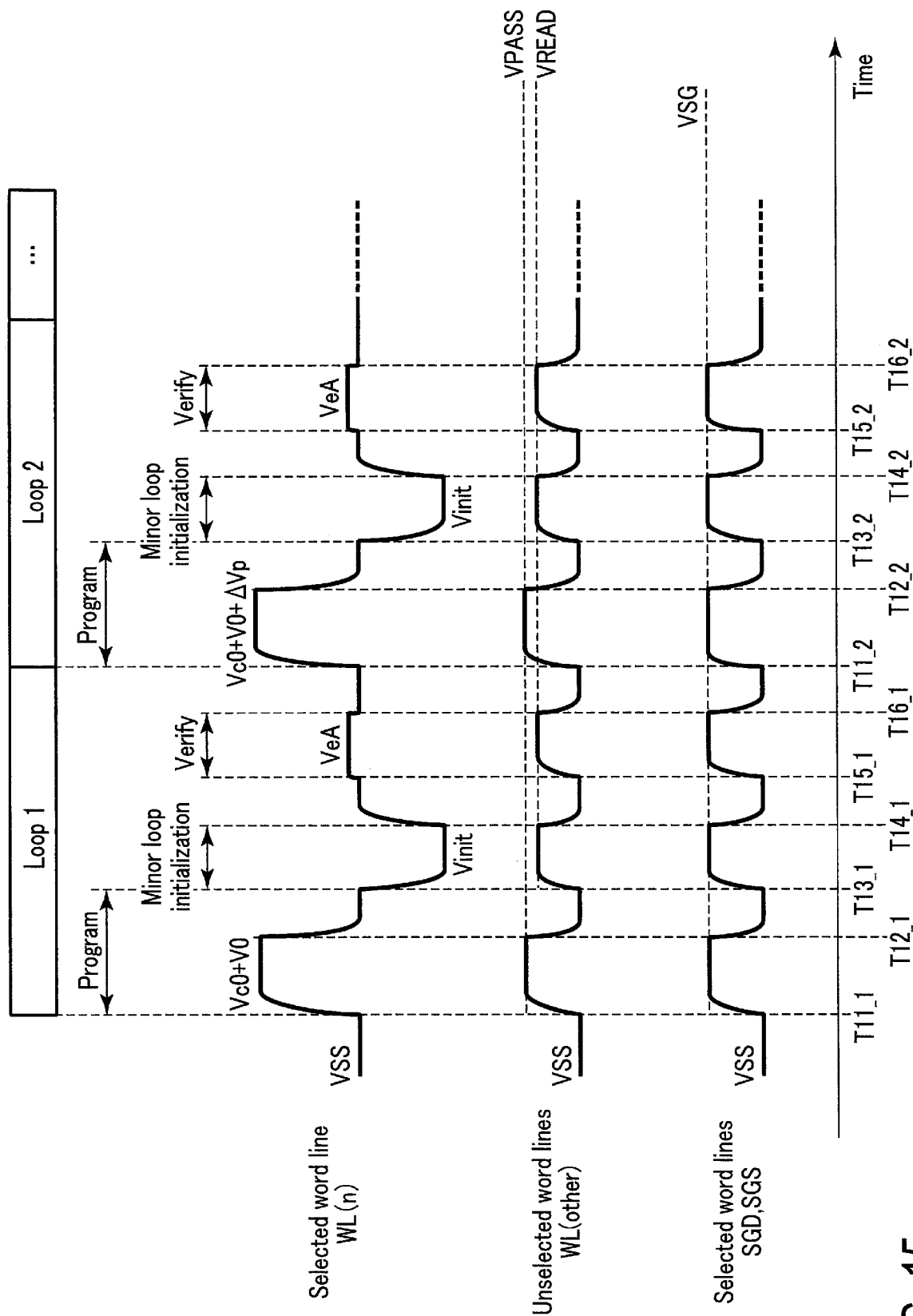
FIG. 15 is a timing chart for explaining a write operation in a semiconductor storage device according to a third embodiment.

FIG. 15 is a timing chart for explaining a write operation in the semiconductor storage device according to the third embodiment. FIG. 15 shows a selected word line WL(n), unselected word lines WL(other), and select gate lines SGD and SGS.

As shown in FIG. 15, from time T11_1 to time T16_1, a first loop is carried out. More specifically, a program operation is carried out from time T11_1 to time T12_1, a minor loop initialization operation is carried out from time T13_1 to time T14_1, and a verify operation is carried out from time T15_1 to time T16_1.

At time T11_1, the row decoder 28 applies a voltage Vc0+V0 to the selected word line WL(n), and applies a voltage VPASS to the unselected word lines WL(other). The row decoder 28 applies the voltage VSG to the select gate lines SGD and SGS. As a result, polarization occurs in the ferroelectric film 34 of the selected memory cell transistor MT(n), and the threshold voltage is lowered.

At time T12_1, the row decoder 28 applies the voltage VSS to the selected word line WL(n), the unselected word lines WL(other), and the select gate lines SGD and SGS. In this manner, the program operation in the first loop is ended.

At time T13_1, the row decoder 28 applies a voltage Vinit to the selected word line WL(n), and applies a voltage VREAD to the unselected word lines WL(other). The row decoder 28 applies the voltage VSG to the select gate lines SGD and SGS. The voltage Vinit is such a low voltage as not to cause erroneous erasure, and is, for example, lower than the verification voltage VeC and higher than the voltage −Vc0 (<0). The voltage Vinit is a voltage that can initialize the minor loop of the ferroelectric film 34, which varies depending on the history of application of the voltage to the word line WL. As a result, the minor loop of the ferroelectric film 34 of the selected memory cell transistor MT(n) is initialized.

At time T14_1, the row decoder 28 applies the voltage VSS to the selected word line WL(n), the unselected word lines WL(other), and the select gate lines SGD and SGS. In this manner, the minor loop initialization operation in the first loop is ended.

At time T15_1, the row decoder 28 applies a voltage VeA to the selected word line WL(n), and applies a voltage VREAD to the unselected word lines WL(other). The row decoder 28 applies the voltage VSG to the select gate lines SGD and SGS. As a result, it is determined whether the program operation in the first loop caused the threshold voltage of the selected memory cell transistor MT(n) to reach the "A" state.

At time T16_1, the row decoder 28 applies the voltage VSS to the selected word line WL(n), the unselected word lines WL(other), and the select gate lines SGD and SGS. In this manner, the verify operation in the first loop is ended.

In the above-mentioned manner, the first loop is ended.

A second loop is carried out from time T11_2 to time T16_2 in the same manner as the first loop except that the voltage applied in the program operation is increased stepwise by ΔVp. Also in the second loop, the minor loop initialization operation is executed, thereby initializing the minor loop of the ferroelectric film 34 of the selected memory cell transistor MT(n).

A third and subsequent loops are carried out in the same manner as the second loop except that the voltage applied to the selected word line WL(n) in the verify operation is sequentially selected from the verification voltages VeA to VeC.

In the above-mentioned manner, the write operation is ended.

3.2 Read Operation

A read operation of the semiconductor storage device according to the third embodiment will be explained.

Figure 16:
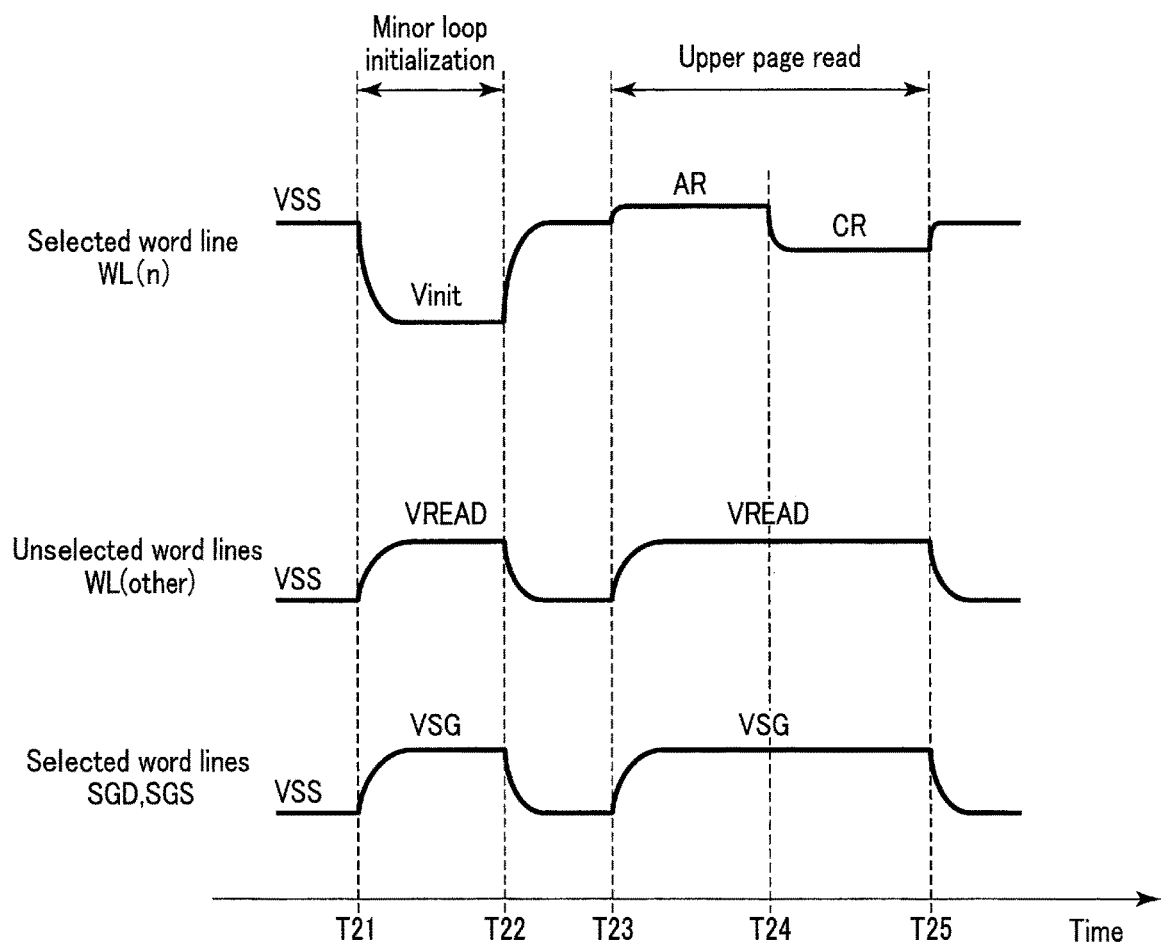
FIG. 16 is a timing chart for explaining a read operation in the semiconductor storage device according to the third embodiment.

FIG. 16 and FIG. 17 are timing charts for explaining the read operation in the semiconductor storage device according to the third embodiment. FIG. 16 shows an example of an operation of reading data stored in an upper page, and FIG. 17 shows an example of an operation of reading data stored in a lower page.

First, an upper page read operation will be described with reference to FIG. 16.

As shown in FIG. 16, in the upper page read operation, the voltage Vinit for minor loop initialization is applied before read voltages AR and CR are applied.

Specifically, at time T21, the row decoder 28 applies the voltage Vinit to the selected word line WL(n), and applies the voltage VREAD to the unselected word lines WL(other). The row decoder 28 applies the voltage VSG to the select gate lines SGD and SOS. As a result, the minor loop of the ferroelectric film 34 of the selected memory cell transistor MT(n) is initialized.

At time T22, the row decoder 28 applies the voltage VSS to the selected word line WL(n), the unselected word lines WL(other), and the select gate lines SGD and SGS. In this manner, the minor loop initialization operation before the upper page read operation is ended.

At time T23, the row decoder 28 applies the read voltage AR to the selected word line WL(n), and applies the voltage VREAD to the unselected word lines WL(other). The row decoder 28 applies the voltage VSG to the select gate lines SGD and SGS. The sense amplifier module 29 reads strobed data from the selected memory cell transistor MT(n) from time T23 to time T24.

At time T24, the row decoder 28 applies the read voltage CR to the selected word line WL(n). The sense amplifier module 29 reads strobed data from the selected memory cell transistor MT(n) from time T24 to time T25. Based on the data read by the read voltages AR and CR, the sense amplifier module 29 specifies the data in the upper page of the selected memory cell transistor MT(n).

At time T25, the row decoder 28 applies the voltage VSS to the selected word line WL(n), the unselected word lines WL(other), and the select gate lines SGD and SGS. In this manner, the upper page read operation is ended.

Next, the lower page read operation will be described with reference to FIG. 17.

As shown in FIG. 17, in the lower page read operation, the voltage Vinit for minor loop initialization is applied before read voltages BR are applied.

Specifically, at time T31, the row decoder 28 applies the voltage Vinit to the selected word line WL(n), and applies the voltage VREAD to the unselected word lines WL(other). The row decoder 28 applies the voltage VSG to the select gate lines SGD and SGS. As a result, the minor loop of the ferroelectric film 34 of the selected memory cell transistor MT(n) is initialized.

At time T32, the row decoder 28 applies the voltage VSS to the selected word line WL(n), the unselected word lines WL(other), and the select gate lines SGD and SGS. In this manner, the minor loop initialization operation before the lower page read operation is ended.

At time T33, the row decoder 28 applies the read voltage BR to the selected word line WL(n), and applies the voltage VREAD to the unselected word lines WL(other). The row decoder 28 applies the voltage VSG to the select gate lines SGD and SGS. The sense amplifier module 29 reads strobed data from the select memory cell transistor MT(n) from time T33 to time T34. Based on the data read by the read voltage BR, the sense amplifier module 29 specifies the data in the lower page of the selected memory cell transistor MT(n).

At time T34, the row decoder 28 applies the voltage VSS to the selected word line WL(n), the unselected word lines WL(other), and the select gate lines SGD and SGS. In this manner, the lower page read operation is ended.

3.3 Effect of Third Embodiment

According to the third embodiment, occurrence of unintended polarization can be suppressed, and the variation of the threshold voltage can be suppressed. This effect will be described below.

FIG. 18 is a diagram for explaining the relationship between an amount of polarization and a gate voltage applied to the memory cell transistor of the semiconductor storage device according to the third embodiment. FIG. 18 shows an example of a minor loop by a broken line in the case where the read voltage AR is applied to a memory cell transistor MT in the "A" state.

As shown in FIG. 18, when the read operation of applying the read voltage AR is applied to the memory cell transistor MT in the "A" state, the polarization amount P varies, for example, along the minor loop shown in FIG. 18, to a point X5 via a point X4. Thus, the polarization amount P of the memory cell transistor MT is increased by executing the read operation, so that the threshold voltage may be changed. The polarization amount P of the memory cell transistor MT may be changed along different minor loops depending on the history of the applied voltage V. Therefore, when a further read operation is executed from the point X5, the polarization amount P is changed along a minor loop different from the minor loop shown in FIG. 18. Thus, the threshold voltage of the memory cell transistor MT may be further changed.

The change in threshold voltage due to the read operation or verify operation may be very small if the operation is only executed few times. However, the change may be significant if the operation is repeated a number of times, which may cause erroneous reading or the like. Therefore, it is desirable to suppress the change in threshold voltage of the memory cell transistor MT each time the read operation or verify operation is executed.

According to the third embodiment, the row decoder 28 applies the voltage Vinit to the selected word line WL(n) before the read operation or verify operation is executed. As a result, the polarization amount P of the memory cell transistor MT at the point X5 in the minor loop shown in FIG. 18 can be initialized to the original polarization amount P via a point X6. Therefore, a next read operation or verify operation can start from the initialized polarization amount P, so that the data can always be read at the same point X4. Accordingly, an erroneous reading can be suppressed, and furthermore the variation of the threshold voltage can be suppressed.

In the third embodiment described above, the read voltages AR and CR are successively applied in the upper page read operation. However, the embodiment is not limited to this. For example, the row decoder 28 may apply the voltage Vinit to initialize the minor loop after applying the read voltage AR and before applying the read voltage CR.

4. Others

The first to third embodiments are not limited to the examples described above, and can be modified in various ways.

For example, the program operation in the write operation of the third embodiment described above is different from the program operation in the first and second embodiment.

However, the embodiments are not limited to this. For example, the program operation of the first and second embodiment may be applied to the program operation in the write operation of the third embodiment.

Thus, the effect of the third embodiment can be obtained in addition to the effect of the first and second embodiments. Specifically, the effect of suppressing the variation of the threshold voltage due to the verify operation by initializing the minor loop can be obtained in addition to the effect of suppressing the variation of the threshold voltage by limiting the number of electrons that contribute to the polarization in each loop.

Furthermore, in the first to third embodiments described above, the semiconductor storage device 20 is controlled by the controller 10 via the NAND interface. However, the embodiments are not limited to this. For example, the semiconductor storage device 20 may be controlled via a RAM interface.

Moreover, in the first to third embodiments described above, the write and read operations are executed in units of pages, but the embodiments are not limited to this. For example, the semiconductor storage device 20 may perform the write and read operations by random access.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor storage device comprising:
   a memory cell transistor string including a plurality of memory cell transistors connected in series;
   a first select transistor connected at a first end of the memory cell transistor string;
   a second select transistor connected at a second end of the memory cell transistor string; and
   a controller,
   wherein:
   in a write operation of writing data into a first memory cell transistor of the memory cell transistor string, the controller performs:
   a first operation of applying a first voltage to a gate of the first memory cell transistor, while turning on the first select transistor and the second select transistor; and
   a second operation of applying a second voltage which is higher than the first voltage to the gate of the first memory cell transistor, while turning off the first select transistor and the second select transistor; and
   the second operation is performed after the first operation.

2. The device of claim 1, wherein:
   in the write operation, the controller further performs a third operation of applying the first voltage to the gate of the first memory cell transistor, while turning off the first select transistor and the second select transistor; and
   the third operation is performed between the first operation and the second operation.

3. The device of claim 2, wherein the controller repeats a set of the first operation, the second operation, and the third operation, and each time the set is repeated, the controller raises the first voltage stepwise.

4. The device of claim 3, wherein each time the set is repeated, the controller further raises the second voltage stepwise.

5. The device of claim 4, wherein each time the set is repeated, an amount of a raise of the first voltage is substantially equal to that of the second voltage.

6. The device of claim 1, wherein each of the memory cell transistors in the memory cell transistor string includes:
   a semiconductor;
   a ferroelectric disposed on the semiconductor; and
   a conductor disposed on the ferroelectric.

7. The device of claim 6, wherein:
   each of the memory cell transistors in the memory cell transistor string further includes an insulator disposed on the semiconductor; and
   the ferroelectric and the insulator sandwich the semiconductor.

8. The device of claim 6, wherein:
   the first voltage is lower than a coercive voltage of the ferroelectric; and
   the second voltage is higher than the coercive voltage.

9. The device of claim 8, wherein:
   in the first operation, the controller applies a third voltage lower than the coercive voltage to a gate of a second memory cell transistor adjacent to the first memory cell transistor included in the memory cell transistor string; and
   in the second operation, the controller applies a fourth voltage lower than the first voltage and the third voltage to the gate of the second memory cell transistor.

10. The device of claim 9, wherein the second memory cell transistor is turned on by application of the third voltage, and turned off by application of the fourth voltage.

11. The device of claim 9, wherein a difference between the third voltage and a threshold voltage of the second memory cell transistor is equal to or less than half of the coercive voltage of the ferroelectric.

12. The device of claim 9, wherein:
   in the first operation, the controller turns on a third memory cell transistor and a fourth memory cell transistor of the memory cell transistor string, the third memory cell transistor being located between the first and second memory cell transistors and the first select transistor, and the fourth memory cell transistor being located between the first and second memory cell transistors and the second select transistor; and
   in the second operation, the controller turns off the third memory cell transistor and the fourth memory cell transistor.

13. The device of claim 12, wherein:
   in the write operation, the controller further performs a third operation of turning off the first select transistor and the second select transistor, applying the first voltage to the gate of the first memory cell transistor, applying the third voltage to the gate of the second memory cell transistor, and turning off the third memory cell transistor and the fourth memory cell transistor; and
   the third operation is performed between the first operation and the second operation.

14. A semiconductor storage device comprising:
   a first memory cell transistor including a semiconductor, a ferroelectric disposed on the semiconductor, and a conductor disposed on the ferroelectric; and
   a controller,
   wherein:
   in a read operation, the controller applies an initialization voltage to a gate of the first memory cell transistor before applying a read voltage; and
   the initialization voltage has a polarity opposite to that of a coercive voltage of the ferroelectric, and has an absolute value smaller than that of the coercive voltage and greater than that of the read voltage.

15. The device of claim 14, further comprising:
a memory cell transistor string including a plurality of memory cell transistors connected in series, the memory cell transistors including the first memory cell transistor;
a first select transistor connected at a first end of the memory cell transistor string;
a second select transistor connected at a second end of the memory cell transistor string;
wherein:
in a write operation of writing data into the first memory cell transistor, the controller performs:
a first operation of applying a first voltage lower than the coercive voltage of the ferroelectric to the gate of the first memory cell transistor, while turning on the first select transistor and the second select transistor; and
a second operation of applying a second voltage which is higher than the first voltage and higher than the coercive voltage to the gate of the first memory cell transistor, while turning off the first select transistor and the second select transistor; and
the second operation is performed after the first operation.

16. The device of claim 15, wherein:
in the write operation, the controller further performs a third operation of applying the first voltage to the gate of the first memory cell transistor, while turning off the first select transistor and the second select transistor; and
the third operation is performed between the first operation and the second operation.

17. The device of claim 15, wherein:
the first memory cell transistor further includes an insulator disposed on the semiconductor; and
the ferroelectric and the insulator sandwich the semiconductor.

18. The device of claim 15, wherein:
in the first operation, the controller applies a third voltage lower than the coercive voltage to a gate of a second memory cell transistor adjacent to the first memory cell transistor included in the memory cell transistor string; and
in the second operation, the controller applies a fourth voltage lower than the first voltage and the third voltage to the gate of the second memory cell transistor.

19. The device of claim 18, wherein the second memory cell transistor is turned on by application of the third voltage, and turned off by application of the fourth voltage.

20. The device of claim 18, wherein:
in the first operation, the controller turns on a third memory cell transistor and a fourth memory cell transistor of the memory cell transistor string, the third memory cell transistor being located between the first and second memory cell transistors and the first select transistor, and the fourth memory cell transistor being located between the first and second memory cell transistors and the second select transistor; and
in the second operation, the controller turns off the third memory cell transistor and the fourth memory cell transistor.

* * * * *